United States Patent
Arasawa et al.

(10) Patent No.: US 9,559,208 B2
(45) Date of Patent: Jan. 31, 2017

(54) LIQUID CRYSTAL DISPLAY DEVICE AND ELECTRONIC DEVICE INCLUDING THE SAME

(75) Inventors: Ryo Arasawa, Isehara (JP); Hideaki Shishido, Atsugi (JP); Shunpei Yamazaki, Setagaya (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 490 days.

(21) Appl. No.: 12/906,178

(22) Filed: Oct. 18, 2010

(65) Prior Publication Data
US 2011/0090416 A1    Apr. 21, 2011

(30) Foreign Application Priority Data
Oct. 21, 2009    (JP) ................................ 2009-242787

(51) Int. Cl.
*G02F 1/136*    (2006.01)
*H01L 29/786*    (2006.01)
(Continued)

(52) U.S. Cl.
CPC ....... *H01L 29/78609* (2013.01); *G09G 3/3614* (2013.01); *G09G 3/3648* (2013.01);
(Continued)

(58) Field of Classification Search
None
See application file for complete search history.

(56) References Cited

U.S. PATENT DOCUMENTS 5,412,493 A * 5/1995 Kunii .................. G02F 1/13454
257/344
5,541,748 A    7/1996 Ono et al.
(Continued)

FOREIGN PATENT DOCUMENTS

CN    001353329 A    6/2002
CN    101548389 A    9/2009
(Continued)

OTHER PUBLICATIONS

International Search Report (Application No. PCT/JP2010/067498) Dated Dec. 28, 2010.
(Continued)

*Primary Examiner* — Richard Kim
(74) *Attorney, Agent, or Firm* — Robinson Intellectual Property Law Office; Eric J. Robinson

(57) ABSTRACT

A liquid crystal display device is provided in which the aperture ratio can be increased in a pixel including a thin film transistor in which an oxide semiconductor is used. In the liquid crystal display device, the thin film transistor including a gate electrode, a gate insulating layer and an oxide semiconductor layer which are provided so as to overlap with the gate electrode, and a source electrode and a drain electrode which overlap part of the oxide semiconductor layer is provided between a signal line and a pixel electrode which are provided in a pixel portion. The off-current of the thin film transistor is $1 \times 10^{-13}$ A or less. A potential can be held only by a liquid crystal capacitor, without a capacitor which is parallel to a liquid crystal element, and a capacitor connected to the pixel electrode is not formed in the pixel portion.

16 Claims, 19 Drawing Sheets

(51) Int. Cl.
*H01L 27/12* (2006.01)
*G09G 3/36* (2006.01)
*G02F 1/1362* (2006.01)
*G02F 1/1343* (2006.01)

(52) U.S. Cl.
CPC ...... *H01L 27/1225* (2013.01); *H01L 29/7869* (2013.01); *G02F 1/13624* (2013.01); *G02F 1/136213* (2013.01); *G02F 2001/134345* (2013.01); *G02F 2201/40* (2013.01); *G09G 2300/0426* (2013.01); *G09G 2300/0439* (2013.01)

(56) References Cited

U.S. PATENT DOCUMENTS

| | | | |
|---|---|---|---|
| 5,598,284 A | 1/1997 | Kogushi et al. | |
| 5,650,636 A | 7/1997 | Takemura et al. | |
| 5,731,856 A | 3/1998 | Kim et al. | |
| 5,744,864 A | 4/1998 | Cillessen et al. | |
| 5,767,832 A | 6/1998 | Koyama et al. | |
| 5,798,746 A | 8/1998 | Koyama | |
| 5,844,538 A | 12/1998 | Shiraki et al. | |
| 5,977,940 A | 11/1999 | Akiyama et al. | |
| 6,067,132 A | 5/2000 | Kim | |
| 6,294,274 B1 | 9/2001 | Kawazoe et al. | |
| 6,384,461 B1 | 5/2002 | Lu et al. | |
| 6,414,738 B1 | 7/2002 | Fujikawa | |
| 6,493,046 B1 | 12/2002 | Ueda | |
| 6,563,174 B2 | 5/2003 | Kawasaki et al. | |
| 6,597,348 B1 | 7/2003 | Yamazaki et al. | |
| 6,661,096 B1 | 12/2003 | Takayama et al. | |
| 6,727,522 B1 | 4/2004 | Kawasaki et al. | |
| 6,738,107 B2 | 5/2004 | Nagase et al. | |
| 6,762,813 B1 | 7/2004 | Zhang et al. | |
| 7,045,816 B2 * | 5/2006 | Ishihara et al. ................. 257/59 | |
| 7,049,190 B2 | 5/2006 | Takeda et al. | |
| 7,053,969 B2 | 5/2006 | Yamazaki et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,129,918 B2 | 10/2006 | Kimura | |
| 7,145,536 B1 | 12/2006 | Yamazaki et al. | |
| 7,211,825 B2 | 5/2007 | Shih et al | |
| 7,212,265 B2 | 5/2007 | Eguchi et al. | |
| 7,235,810 B1 | 6/2007 | Yamazaki et al. | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,317,438 B2 | 1/2008 | Yamazaki et al. | |
| 7,321,353 B2 | 1/2008 | Tsuda et al. | |
| 7,323,356 B2 | 1/2008 | Hosono et al. | |
| 7,385,224 B2 | 6/2008 | Ishii et al. | |
| 7,385,579 B2 | 6/2008 | Satake | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,614 B2 | 4/2009 | Jeong et al. | |
| 7,601,984 B2 | 10/2009 | Sano et al. | |
| 7,612,849 B2 | 11/2009 | Eguchi et al. | |
| 7,674,650 B2 | 3/2010 | Akimoto et al. | |
| 7,732,819 B2 | 6/2010 | Akimoto et al. | |
| 7,738,055 B2 | 6/2010 | Egi et al. | |
| 7,767,106 B2 | 8/2010 | Chang | |
| 7,777,825 B2 | 8/2010 | Noda et al. | |
| 7,791,072 B2 | 9/2010 | Kumomi et al. | |
| 7,791,074 B2 | 9/2010 | Iwasaki | |
| 7,791,571 B2 | 9/2010 | Ohtani et al. | |
| 7,804,091 B2 | 9/2010 | Takechi et al. | |
| 7,816,191 B2 | 10/2010 | Takayama et al. | |
| 7,821,613 B2 | 10/2010 | Kimura | |
| 7,903,190 B2 | 3/2011 | Noda et al. | |
| 7,906,429 B2 | 3/2011 | Takayama et al. | |
| 7,935,582 B2 | 5/2011 | Iwasaki | |
| 7,956,361 B2 | 6/2011 | Iwasaki | |
| 7,994,500 B2 | 8/2011 | Kim et al. | |
| 7,998,372 B2 | 8/2011 | Yano et al. | |
| 8,058,645 B2 | 11/2011 | Jeong et al. | |
| 8,084,331 B2 | 12/2011 | Ofuji et al. | |
| 8,134,154 B2 | 3/2012 | Gosain et al. | |
| 8,143,115 B2 | 3/2012 | Omura et al. | |
| 8,148,721 B2 | 4/2012 | Hayashi et al. | |
| 8,148,779 B2 | 4/2012 | Jeong et al. | |
| 8,188,480 B2 | 5/2012 | Itai | |
| 8,193,045 B2 | 6/2012 | Omura et al. | |
| 8,202,365 B2 | 6/2012 | Umeda et al. | |
| 8,203,143 B2 | 6/2012 | Imai | |
| 8,242,837 B2 | 8/2012 | Yamazaki et al. | |
| 8,253,138 B2 | 8/2012 | Yamazaki et al. | |
| 8,269,217 B2 | 9/2012 | Arai et al. | |
| 8,330,887 B2 | 12/2012 | Kurokawa et al. | |
| 8,384,077 B2 | 2/2013 | Yano et al. | |
| 8,400,187 B2 | 3/2013 | Yamazaki et al. | |
| 8,618,545 B2 | 12/2013 | Gosain et al. | |
| 8,786,527 B2 | 7/2014 | Umezaki et al. | |
| 8,890,781 B2 | 11/2014 | Yamazaki et al. | |
| 2001/0043292 A1 * | 11/2001 | Tsujimura et al. ............. 349/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0154084 A1 | 10/2002 | Tanaka et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0263719 A1 | 12/2004 | Inoue et al. | |
| 2005/0017302 A1 | 1/2005 | Hoffman | |
| 2005/0018105 A1 | 1/2005 | Inoue et al. | |
| 2005/0024556 A1 | 2/2005 | Nakahata et al. | |
| 2005/0030445 A1 | 2/2005 | Inoue et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0050193 A1 | 3/2006 | Seki et al. | |
| 2006/0061700 A1 * | 3/2006 | Chung .............. G02F 1/136213 349/38 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0158573 A1 * | 7/2006 | Huh .................. G02F 1/13306 349/33 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0001954 A1 | 1/2007 | Shishido et al. | |
| 2007/0024187 A1 | 2/2007 | Shin et al. | |
| 2007/0046191 A1 | 3/2007 | Saito | |
| 2007/0046591 A1 | 3/2007 | Shishido et al. | |
| 2007/0052025 A1 | 3/2007 | Yabuta | |
| 2007/0054507 A1 | 3/2007 | Kaji et al. | |
| 2007/0075627 A1 | 4/2007 | Kimura et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |

(56) References Cited

U.S. PATENT DOCUMENTS

| | | |
|---|---|---|
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0279344 A1 | 12/2007 | Kimura et al. |
| 2007/0279374 A1 | 12/2007 | Kimura et al. |
| 2007/0287296 A1 | 12/2007 | Chang |
| 2008/0006877 A1 | 1/2008 | Mardilovich et al. |
| 2008/0035920 A1 | 2/2008 | Takechi et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0055218 A1 | 3/2008 | Tsuda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0117348 A1* | 5/2008 | Chen .............. 349/46 |
| 2008/0119018 A1 | 5/2008 | Toyota et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0198285 A1 | 8/2008 | Hsieh et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284929 A1 | 11/2008 | Kimura |
| 2008/0296568 A1 | 12/2008 | Ryu et al. |
| 2008/0297676 A1 | 12/2008 | Kimura |
| 2009/0002586 A1 | 1/2009 | Kimura |
| 2009/0002590 A1 | 1/2009 | Kimura |
| 2009/0009455 A1 | 1/2009 | Kimura |
| 2009/0011611 A1 | 1/2009 | Ichijo et al. |
| 2009/0045397 A1* | 2/2009 | Iwasaki ............. H01L 29/78693 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0174835 A1 | 7/2009 | Lee et al. |
| 2009/0207328 A1* | 8/2009 | Hur et al. .............. 349/37 |
| 2009/0244419 A1 | 10/2009 | Nakamura et al. |
| 2009/0256816 A1 | 10/2009 | Kim |
| 2009/0261325 A1 | 10/2009 | Kawamura et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2010/0007810 A1 | 1/2010 | Nakamura |
| 2010/0051936 A1 | 3/2010 | Hayashi et al. |
| 2010/0065844 A1 | 3/2010 | Tokunaga |
| 2010/0084651 A1 | 4/2010 | Yamazaki et al. |
| 2010/0092800 A1 | 4/2010 | Itagaki et al. |
| 2010/0109002 A1 | 5/2010 | Itagaki et al. |
| 2010/0149138 A1* | 6/2010 | Lee ............. G09G 3/3648 345/204 |
| 2010/0155719 A1 | 6/2010 | Sakata et al. |
| 2010/0245697 A1 | 9/2010 | Shiiba et al. |
| 2010/0276689 A1 | 11/2010 | Iwasaki |
| 2010/0279462 A1 | 11/2010 | Iwasaki |
| 2010/0283049 A1 | 11/2010 | Sato et al. |
| 2010/0289020 A1 | 11/2010 | Yano et al. |
| 2010/0296020 A1 | 11/2010 | Noda et al. |
| 2010/0304539 A1* | 12/2010 | Matsuura ............. H01L 27/1085 438/243 |
| 2010/0320458 A1 | 12/2010 | Umeda et al. |
| 2010/0320459 A1 | 12/2010 | Umeda et al. |
| 2010/0320471 A1 | 12/2010 | Takechi et al. |
| 2011/0032435 A1 | 2/2011 | Kimura |
| 2011/0068852 A1 | 3/2011 | Yamazaki et al. |
| 2011/0089927 A1 | 4/2011 | Yamazaki et al. |
| 2011/0090183 A1 | 4/2011 | Yamazaki et al. |
| 2011/0090184 A1 | 4/2011 | Yamazaki et al. |
| 2011/0090186 A1 | 4/2011 | Yamazaki et al. |
| 2011/0134345 A1 | 6/2011 | Yamazaki et al. |
| 2011/0193083 A1 | 8/2011 | Kim et al. |
| 2011/0210327 A1 | 9/2011 | Kondo et al. |
| 2011/0215328 A1 | 9/2011 | Morosawa et al. |
| 2012/0001881 A1 | 1/2012 | Miyake et al. |
| 2012/0119205 A1 | 5/2012 | Taniguchi et al. |
| 2012/0168750 A1 | 7/2012 | Hayashi et al. |
| 2014/0327662 A1 | 11/2014 | Umezaki et al. |
| 2015/0084048 A1 | 3/2015 | Hayashi et al. |

FOREIGN PATENT DOCUMENTS

| | | |
|---|---|---|
| EP | 1209748 A | 5/2002 |
| EP | 1737044 A | 12/2006 |
| EP | 2092569 A | 8/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-010299 A | 1/1989 |
| JP | 02-137825 A | 5/1990 |
| JP | 02-240636 A | 9/1990 |
| JP | 04-302289 A | 10/1992 |
| JP | 05-034724 A | 2/1993 |
| JP | 05-251705 A | 9/1993 |
| JP | 06-347831 A | 12/1994 |
| JP | 07-191304 A | 7/1995 |
| JP | 08-264794 A | 10/1996 |
| JP | 09-321305 A | 12/1997 |
| JP | 10-122144 A | 5/1998 |
| JP | 10-274782 A | 10/1998 |
| JP | 11-505377 | 5/1999 |
| JP | 11-274504 A | 10/1999 |
| JP | 2000-044236 A | 2/2000 |
| JP | 2000-150900 A | 5/2000 |
| JP | 2000-275611 A | 10/2000 |
| JP | 2001-013518 A | 1/2001 |
| JP | 2001-166331 A | 6/2001 |
| JP | 2002-014320 A | 1/2002 |
| JP | 2002-050762 A | 2/2002 |
| JP | 2002-055326 A | 2/2002 |
| JP | 2002-076356 A | 3/2002 |
| JP | 2002-289859 A | 10/2002 |
| JP | 2002-323707 A | 11/2002 |
| JP | 2003-050405 A | 2/2003 |
| JP | 2003-086000 A | 3/2003 |
| JP | 2003-086808 A | 3/2003 |
| JP | 2003-131633 A | 5/2003 |
| JP | 2004-103957 A | 4/2004 |
| JP | 2004-245641 A | 9/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| JP | 2006-165532 A | 6/2006 |
| JP | 2006-286773 A | 10/2006 |
| JP | 2007-103918 A | 4/2007 |
| JP | 2007-142195 A | 6/2007 |
| JP | 2007-154785 A | 6/2007 |
| JP | 2007-194594 A | 8/2007 |
| JP | 2008-040343 A | 2/2008 |
| JP | 2008-042067 A | 2/2008 |
| JP | 2008-129314 A | 6/2008 |
| JP | 2008-166716 A | 7/2008 |
| JP | 2009-010362 A | 1/2009 |
| JP | 2009-055008 A | 3/2009 |
| JP | 2009-135482 A | 6/2009 |
| JP | 2009-141221 A | 6/2009 |

(56) References Cited

FOREIGN PATENT DOCUMENTS

| | | |
|---|---|---|
| JP | 2009-158940 A | 7/2009 |
| JP | 2009-224354 A | 10/2009 |
| JP | 4404881 | 1/2010 |
| JP | 2010-177431 A | 8/2010 |
| KR | 2002-0038482 A | 5/2002 |
| KR | 2009-0089444 A | 8/2009 |
| TW | 588209 | 5/2004 |
| TW | 200841475 | 10/2008 |
| WO | WO-2004/114391 | 12/2004 |
| WO | WO-2006/064789 | 6/2006 |
| WO | WO-2007/029844 | 3/2007 |
| WO | WO-2008/069056 | 6/2008 |
| WO | WO-2008/069255 | 6/2008 |
| WO | WO-2008/149873 | 12/2008 |
| WO | WO-2009/060922 | 5/2009 |

OTHER PUBLICATIONS

Written Opinion (Application No. PCT/JP2010/067498) Dated Dec. 28, 2010.

Fortunato.E et al., "Wide-Bandgap High-Mobility ZnO Thin-Film Transistors Produced at Room Temperature,", Appl. Phys. Lett. (Applied Physics Letter), Sep. 27, 2004, vol. 85, No. 13, pp. 2541-2543.

Dembo.H et al., "RFCPUS on Glass and Plastic Substrates Fabricated By TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMo3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al.,"65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic NaNo-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Techincal Papers, 2007, vol. 38, pp. 1737-1740.

Nakamura,M. "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel, YbFe2O4, and Yb2Fe3O7 Types of Structures for Compounds in the In2O3 and Sc2O3-A2O3-BO Systems [A; Fe, Ga, Or Al; B: Mg, Mn, Fe, Ni, Cu,Or Zn ]at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Naoshi Suzuki, "Principle of low-current measurement and actual picoammeter", Oyobuturi, Jul. 10, 2001, vol. 70, No. 7, pp. 868-871, JSAP (The Japan Society of Applied Physics).

Shen.T et al., "A 2-ns Detecting Time, 2-μm CMOS Built-in Current Sensing Circuit", IEEE Journal of Solid-State Circuits, Jan. 1993, vol. 28, No. 1, pp. 72-77.

Thelen.D et al., "A Low Noise Readout Detector Circuit for Nanoampere Sensor Applications", IEEE Journal of Solid-State Circuits, Mar. 3, 1997, vol. 32, No. 3, pp. 337-348.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Chinese Office Action (Application No. 201080049068.9) Dated May 30, 2014.

Taiwanese Office Action (Application No. 099135074) Dated Jun. 25, 2015.

\* cited by examiner

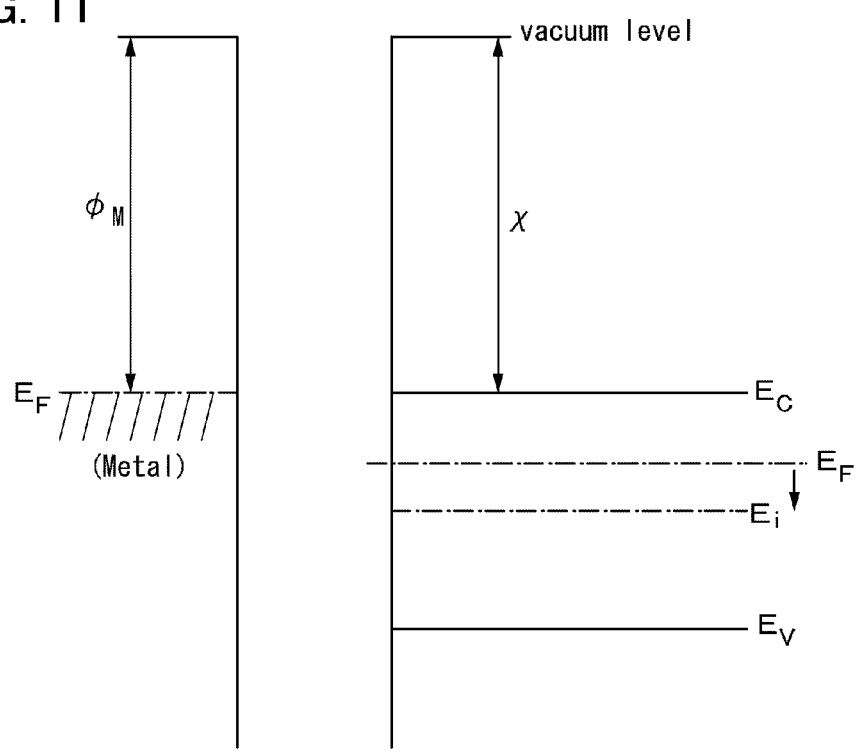

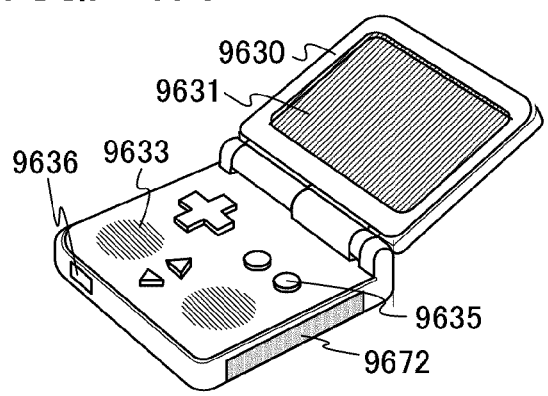
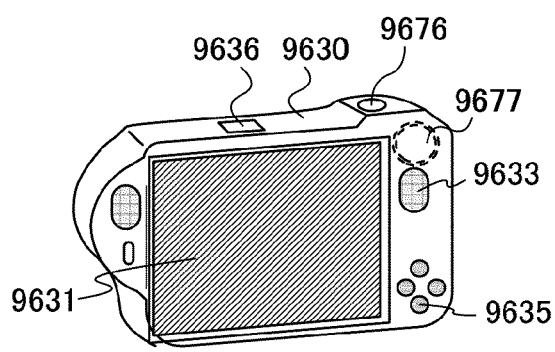
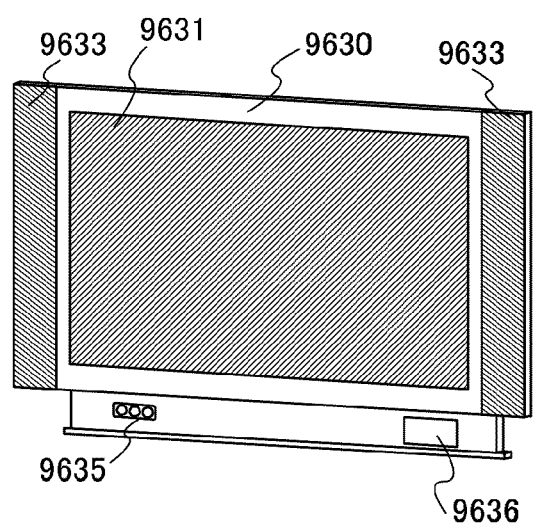

LIQUID CRYSTAL DISPLAY DEVICE AND ELECTRONIC DEVICE INCLUDING THE SAME

TECHNICAL FIELD

One embodiment of the present invention relates to a semiconductor device including a field-effect transistor using an oxide semiconductor.

In this specification, a semiconductor device means all types of devices which can function by utilizing semiconductor characteristics, and an electro-optical device such as a liquid crystal display device, a semiconductor circuit, and an electronic device are all semiconductor devices.

BACKGROUND ART

A technique for forming thin film transistors using a semiconductor thin film formed over a substrate having an insulating surface has attracted attention. The thin film transistors are used for display devices typified by liquid crystal televisions. A silicon-based semiconductor material is known as a material for a thin semiconductor film applicable to a thin film transistor. As another material, an oxide semiconductor has attracted attention.

As a material for the oxide semiconductor, zinc oxide and a material containing zinc oxide as its component are known. Further, a thin film transistor formed using an amorphous oxide (oxide semiconductor) having an electron carrier concentration of less than $10^{18}/cm^3$ is disclosed (Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

However, a difference from a stoichiometric composition of an oxide semiconductor film occurs in the formation process, which becomes a problem in some cases. For example, in the case where oxygen in a film is excess or deficient, or the case where hydrogen contained as an impurity becomes an electron donor, electrical conductivity changes.

Even when having an electron carrier concentration of less than $10^{18}/cm^3$, an oxide semiconductor is a substantially n-type oxide semiconductor, and an on-off ratio of the thin film transistor disclosed in the Patent Documents is only about $10^3$. Such a low on-off ratio of the thin film transistor is due to large off-current.

It is an object of one embodiment of the present invention to provide a display device including a thin film transistor having stable electric characteristics (e.g., an off-current is extremely reduced).

One embodiment of the present invention is a liquid crystal display device including a thin film transistor in which a channel region is formed using an oxide semiconductor which is an intrinsic or substantially intrinsic semiconductor obtained by removal of impurities serving as electron donors (donors) in the oxide semiconductor and which has a larger energy gap than a silicon semiconductor.

That is, one embodiment of the present invention is a liquid crystal display device including a thin film transistor in which a channel region is formed using an oxide semiconductor film. Hydrogen or an OH bond contained in the oxide semiconductor is extremely reduced so that hydrogen is contained at $5\times10^{19}/cm^3$ or less, preferably $5\times10^{18}/cm^3$ or less, more preferably $5\times10^{17}/cm^3$ or less in the oxide semiconductor, and the carrier concentration of the oxide semiconductor film is set to $5\times10^{14}/cm^3$ or less, preferably $5\times10^{12}/cm^3$ or less.

The energy gap of the oxide semiconductor is 2 eV or more, preferably 2.5 eV or more, more preferably 3 eV or more and an impurity such as hydrogen which forms a donor is extremely reduced so that the carrier concentration is $1\times10^{14}/cm^3$ or less, preferably $1\times10^{12}/cm^3$ or less.

When such a highly purified oxide semiconductor is used for a channel formation region of a thin film transistor, even in the case where the channel width is 10 mm and the drain voltage is 10 V, the oxide semiconductor operates so that the drain current is $1\times10^{-13}$A or less at a gate voltage of −5 V to 20 V.

One embodiment of the present invention disclosed in this specification is a liquid crystal display device. In the liquid crystal display device, a thin film transistor including a gate electrode, a gate insulating layer which is provided so as to overlap the gate electrode, an oxide semiconductor layer which is provided so as to overlap the gate electrode with the gate insulating layer interposed therebetween, and a source electrode and a drain electrode which are provided so as to overlap part of the oxide semiconductor layer is provided between a signal line and a pixel electrode which are provided in a pixel portion. An auxiliary capacitor which is electrically connected to the pixel electrode is not formed.

Another embodiment of the present invention disclosed in this specification is a liquid crystal display device. In the liquid crystal display device, a thin film transistor includes a gate electrode, a gate insulating layer which is provided so as to overlap the gate electrode, an oxide semiconductor layer which is provided so as to overlap the gate electrode with the gate insulating layer interposed therebetween, and a source electrode and a drain electrode which are provided so as to overlap part of the oxide semiconductor layer. The thin film transistor is provided between a signal line and a pixel electrode which are each provided in a plurality of subpixels in one pixel. An auxiliary capacitor which is electrically connected to the pixel electrode is not formed.

Note that an auxiliary capacitor refers to a capacitor which is intentionally provided, and parasitic capacitance which is not intentionally provided may be formed.

According to one embodiment of the present invention, a capacitor to hold a signal voltage applied to a pixel is not necessarily provided because the off-current is reduced to $1\times10^{-13}$ A or less. That is, since an auxiliary capacitor is not necessarily provided in each pixel, the aperture ratio can be improved. In addition, a pixel using a thin film transistor according to one embodiment of the present invention can be kept in a certain state (a state where a video signal is written) and thus stable operation can be performed even in the case where a still image is displayed.

BRIEF DESCRIPTION OF DRAWINGS

FIG. 10A illustrates a state in which a positive voltage ($+V_G$) is applied to a gate (G1) and FIG. 10B illustrates a state in which a negative voltage ($-V_G$) is applied to the gate (G1).

FIG. 11 shows a relation between the vacuum level and the work function of a metal ($\phi_M$) and a relation between the vacuum level and the electron affinity ($\chi$) of an oxide semiconductor.

FIGS. 17A to 17C each illustrate an electronic device.

BEST MODE FOR CARRYING OUT THE INVENTION

Figure 1A:
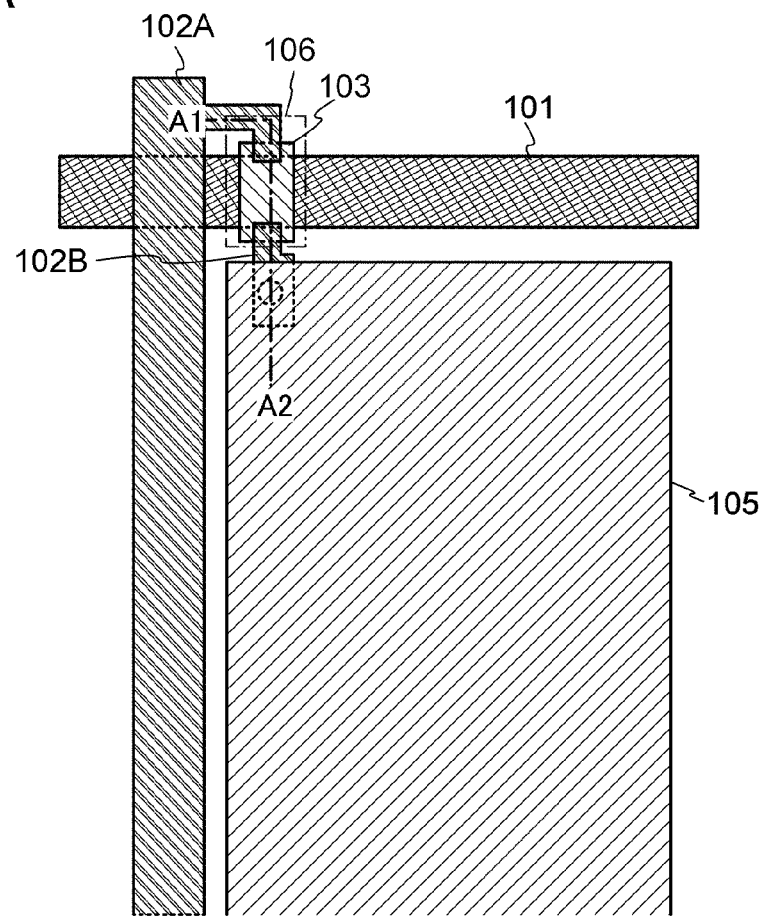
FIGS. 1A and 1B are a top view and a cross-sectional view of a liquid crystal display device.

Embodiments of the present invention will be described in detail with reference to the accompanying drawings. The present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein. Note that in the structures of the present invention described below, the same reference numerals are used for the same portions and portions having similar functions in different drawings, and the description thereof is not repeated.

Note that the size, the thickness of a layer, or a region of each structure illustrated in drawings in this specification is exaggerated for simplicity in some cases. Therefore, embodiments of the present invention are not limited to such scales.

Note that the terms such as "first", "second", and "third" used in this specification are used in order to avoid confusion of structural elements and do not mean limitation of the number of the structural elements. Therefore, for example, the term "first" can be replaced with the term "second", "third", or the like as appropriate.

Embodiment 1

An example is described below in which a pixel of a liquid crystal display device is formed using a thin film transistor according to one embodiment of the present invention. In this embodiment, in a liquid crystal display device, a thin film transistor included in a pixel and an electrode (also referred to as a pixel electrode) connected to the thin film transistor will be shown and described as an example. Note that a pixel includes elements provided in each pixel of a display device, for example, a thin film transistor, an electrode functioning as a pixel electrode, a wiring for supplying an electric signal to the element, and the like. Note that a pixel may include a color filter or the like. For example, in a color display device including color elements of R, G, and B, a minimum unit of an image is composed of three pixels of an R pixel, a G pixel, and a B pixel.

Note that when it is described that "A and B are connected", the case where A and B are electrically connected to each other, and the case where A and B are directly connected to each other are included therein. Here, A and B are each an object (e.g., a device, an element, a circuit, a wiring, an electrode, a terminal, a conductive film, a layer, or the like).

A storage capacitance is a combination of a capacitance of a liquid crystal element and a capacitance of a capacitor which is provided separately. The former is referred to as a liquid crystal capacitance and the latter is referred to as an auxiliary capacitance for distinction.

Figure 2A:
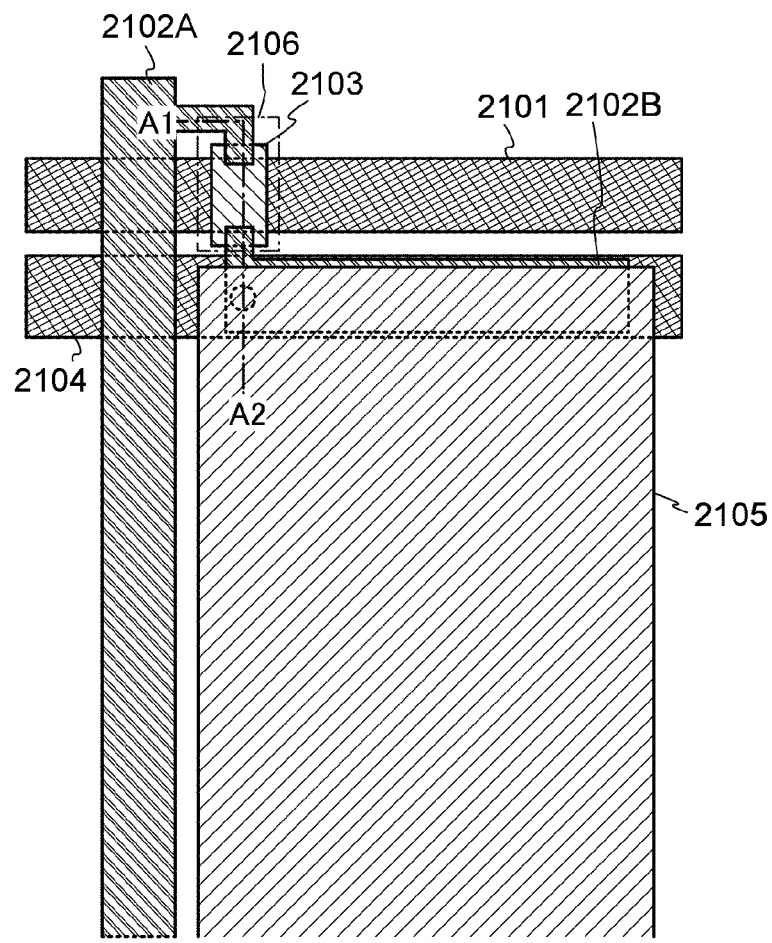
FIGS. 2A and 2B are a top view and a cross-sectional view of a liquid crystal display device.

First, as an example of a pixel portion in a conventional liquid crystal display device, a top view is illustrated in FIG. 2A. A thin film transistor illustrated in FIG. 2A has a kind of bottom-gate structure called an inverted staggered structure in which a wiring layer serving as a source electrode and a drain electrode is provided over an oxide semiconductor layer overlapped with a gate electrode.

A pixel portion illustrated in FIG. 2A includes a first wiring 2101 functioning as a scan line, a second wiring 2102A functioning as a signal line, an oxide semiconductor layer 2103, a capacitor line 2104, and a pixel electrode 2105. Moreover, the pixel portion in FIG. 2A includes a third wiring 2102B for electrically connecting the oxide semiconductor layer 2103 and the pixel electrode 2105.

The first wiring 2101 also functions as a gate electrode of a thin film transistor 2106.

The second wiring 2102A also functions as one of a source electrode and a drain electrode of the thin film transistor 2106 and one electrode of a capacitor.

The third wiring 2102B also functions as the other of the source electrode and the drain electrode of the thin film transistor 2106.

The capacitor line 2104 functions as the other electrode of the capacitor. Note that the first wiring 2101 and the capacitor line 2104 are formed in the same layer, and the second wiring 2102A and the third wiring 2102B are formed in the same layer. In addition, the third wiring 2102B and the capacitor line 2104 partly overlap with each other to form an auxiliary capacitor (a capacitor) of a liquid crystal element. The oxide semiconductor layer 2103 included in the thin film transistor 2106 is provided over the first wiring 2101 with a gate insulating film 2113 (not illustrated) therebetween.

Figure 2B:
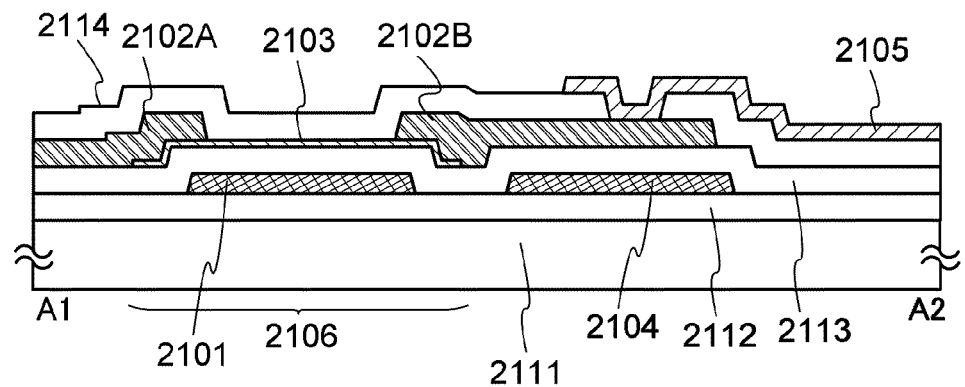

FIG. 2B illustrates a cross-sectional structure along chain line A1-A2 in FIG. 2A.

In the cross-sectional structure illustrated in FIG. 2B, the first wiring 2101 serving as the gate electrode and the capacitor line 2104 are provided over a substrate 2111 with a base film 2112 therebetween. The gate insulating film 2113 is provided so as to cover the first wiring 2101 and the capacitor line 2104. The oxide semiconductor layer 2103 is provided over the gate insulating film 2113. Further, the second wiring 2102A and the third wiring 2102B are provided over the oxide semiconductor layer 2103, and an oxide insulating layer 2114 functioning as a passivation film is provided thereover. An opening portion is formed in the oxide insulating layer 2114. The pixel electrode 2105 and the third wiring 2102B are connected to each other in the opening portion. A capacitor is formed by the third wiring 2102B and the capacitor line 2104, using the gate insulating film 2113 as a dielectric.

Figure 7:
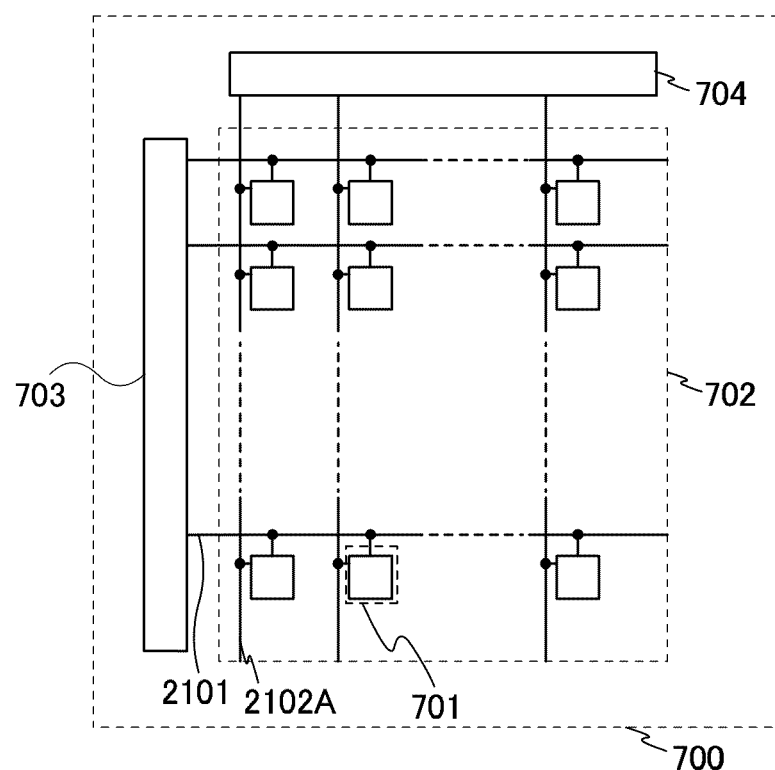
FIG. 7 illustrates a liquid crystal display device.

Note that the pixel illustrated in FIGS. 2A and 2B corresponds to one of a plurality of pixels 701 arranged in a matrix over a substrate 700 as illustrated in FIG. 7. FIG. 7 illustrates a structure in which a pixel portion 702, a scan line driver circuit 703, and a signal line driver circuit 704 are placed over the substrate 700. Whether the pixels 701 are in a selected state or in a non-selected state is determined per row in accordance with a scan signal supplied from the first wiring 101 connected to the scan line driver circuit 703. The pixel 701 selected by the scan signal is supplied with a video voltage (also referred to as an image signal, a video signal, or video data) from the wiring 2102A connected to the signal line driver circuit 704.

FIG. 7 illustrates the structure in which the scan line driver circuit 703 and the signal line driver circuit 704 are provided over the substrate 700; alternatively, one of the scan line driver circuit 703 and the signal line driver circuit 704 may be provided over the substrate 700. Only the pixel portion 702 may be provided over the substrate 700.

FIG. 7 illustrates an example in which the plurality of pixels 701 is arranged in a matrix (in stripe) in the pixel portion 702. Note that the pixels 701 are not necessarily arranged in a matrix and may be arranged in a delta pattern or Bayer arrangement. As a display method of the pixel portion 702, a progressive method or an interlace method can be employed. Note that color elements controlled in the pixel for color display are not limited to three colors of R (red), G (green), and B (blue), and for example, RGBW (W corresponds to white), or RGB added with one or more of yellow, cyan, magenta, and the like may be employed. Further, the size of display regions may be different between dots of color elements.

In FIG. 7, the first wirings 2101 and the second wirings 2102A are formed in accordance with the number of pixels in the row direction and column direction. Note that the numbers of the first wirings 2101 and the second wirings 2102A may be increased depending on the number of subpixels included in one pixel or the number of transistors in the pixel. The pixels 701 may be driven with the first wiring 2101 and the second wiring 2102A shared with some pixels.

Note that in FIG. 2A, the second wiring 2102A is rectangular; alternatively, the second wiring 2102A may surround the third wiring 2102B (specifically, the second wiring 2102A may be in a U-shape or C-shape) so that the area of a region where carriers move is increased to increase the amount of current flowing.

Note that a thin film transistor is an element having at least three terminals of a gate, a drain, and a source. The thin film transistor has a channel region between a drain region and a source region, and current can flow through the drain region, the channel region, and the source region. Here, since the source and the drain of the transistor may interchange depending on the structure, the operating condition, and the like of the transistor, it is difficult to define which is a source or a drain. Therefore, a region functioning as a source or a drain is not called the source or the drain in some cases. In such a case, for example, one of the source and the drain is referred to as a first terminal, a first electrode, or a first region and the other of the source and the drain is referred to as a second terminal, a second electrode, or a second region in some cases.

Figure 1B:
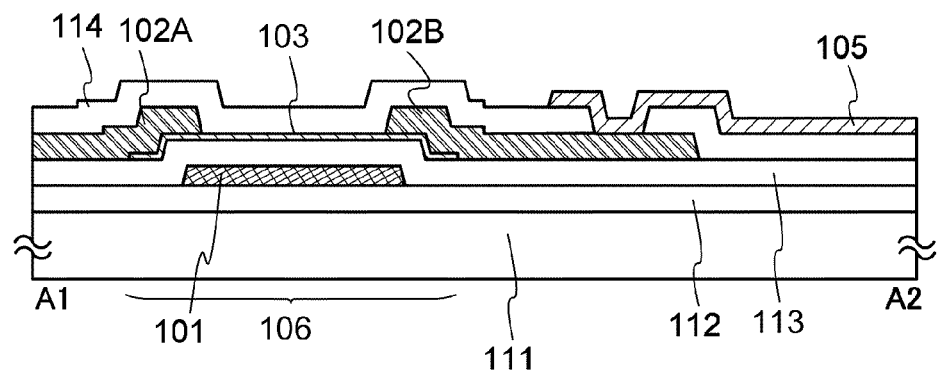

Next, an example of a structure of a pixel portion according to one embodiment of the present invention is illustrated in FIGS. 1A and 1B. FIG. 1A illustrates a structure in which a capacitor (an auxiliary capacitor) is omitted from the structure of the pixel portion of the conventional example in FIG. 2A. Therefore, a capacitor line is not necessary, and the third wiring 102B does not function as an electrode of the capacitor. The third wiring 102B serves a wiring connected to only a pixel electrode 105 as the source electrode or the drain electrode, which leads to reduction in area. Thus, the aperture ratio can be significantly increased.

Note that an example of a structure of a pixel portion in which a capacitor is omitted, which is one embodiment of the present invention, can have the same structure (except a capacitor) as the above-described conventional example. Although a transistor having an inverted staggered structure is described as an example, a transistor having another structure such as a bottom contact structure or a top gate structure may be used.

In order to omit a capacitor from a pixel portion as described above, the potential of the pixel needs to be held only by a charged liquid crystal element for a certain period. To realize this, the off-current of a thin film transistor needs to be sufficiently reduced. One example of a manufacturing method of a thin film transistor to achieve these characteristics is described with reference to FIGS. 3A to 3D.

A glass substrate can be used as the light-transmitting substrate 111. A base film 112 is provided over the substrate 111 in order to prevent diffusion of impurities from the substrate 111 or improve adhesion between the substrate 111 and elements provided over the substrate 111. Note that the base film 112 is not necessarily provided.

Figure 3A:
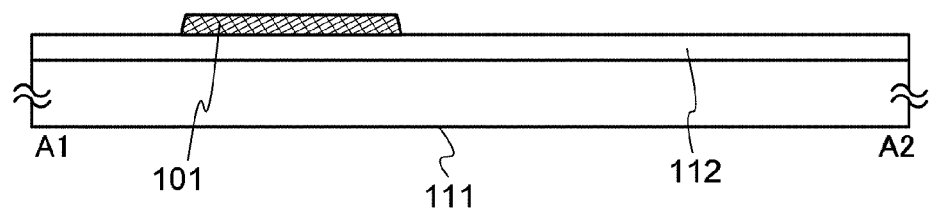
FIGS. 3A to 3D are cross-sectional views illustrating a method for manufacturing a liquid crystal display device.

Next, a conductive layer is formed over the base film 112. After that, a first photolithography step is performed so that a resist mask is formed and unnecessary portions are removed by etching, whereby the first wiring 101 is formed. At this time, etching is preferably performed so that edges of the first wiring 101 are tapered. FIG. 3A is a cross-sectional view at this stage.

The first wiring 101 is preferably formed using a low-resistance conductive material such as aluminum or copper. Since the use of aluminum alone has disadvantages such as low heat resistance and a tendency to be corroded, aluminum is preferably used in combination with a conductive material having heat resistance. As the conductive material having heat resistance, it is possible to use an element selected from titanium, tantalum, tungsten, molybdenum, chromium, neodymium, and scandium; an alloy containing any of these elements as its component; an alloy containing a combination of any of these elements; or a nitride containing any of these elements as its component.

Note that the wirings and the like included in the thin film transistor can be formed by an inkjet method or a printing method. Since the wirings and the like can be manufactured without using a photomask, a layout of the transistor can be changed easily. Further, it is not necessary to use a resist, so that material cost is reduced and the number of steps can be reduced. In addition, a resist mask and the like can also be formed by an inkjet method or a printing method. Since a resist mask can be formed only over intended portions by an inkjet method or a printing method, cost can be reduced.

A resist mask having regions with a plurality of thicknesses (typically, two kinds of thicknesses) may be formed using a multi-tone mask to form wirings and the like.

Then, an insulating film (hereinafter referred to as a gate insulating film 113) is formed over the first wiring 101.

In this embodiment, the gate insulating film 113 is formed using a high-density plasma CVD apparatus in which a microwave (2.45 GHz) is used. Here, a high-density plasma CVD apparatus refers to an apparatus which can realize a plasma density higher than or equal to $1 \times 10^{11}/cm^3$. For example, plasma is generated by applying a microwave power higher than or equal to 3 kW and lower than or equal to 6 kW so that an insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating film is formed over a substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has a small thickness, and reliability can be ensured even when it has a thickness less than 100 nm, for example.

In forming the gate insulating film 113, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Further, the insulating film formed using the high-density plasma CVD apparatus has excellent step coverage and the thickness thereof can be controlled precisely.

The insulating film formed through the above process procedure is greatly different from the insulating film formed using a conventional parallel plate PCVD apparatus. The etching rate of the insulating film formed through the above process procedure is lower than that of the insulating film formed using the conventional parallel plate PCVD apparatus by 10% or more or 20% or more in the case where the etching rates with the same etchant are compared to each other. Thus, it can be said that the insulating film formed using the high-density plasma CVD apparatus is a dense film.

In this embodiment, a silicon oxynitride film (also referred to as $SiO_xN_y$, where x>y>0) with a thickness of 100 nm formed using the high-density plasma CVD apparatus is used as the gate insulating film 113.

As another formation method of the gate insulating film 113, a sputtering method may be employed. It is needless to say that the gate insulating film 113 is not limited to such a silicon oxide film and may be formed with a single-layer structure or a layered structure of another insulating film such as a silicon oxynitride film, a silicon nitride film, an aluminum oxide film, or a tantalum oxide film.

Note that before the deposition of an oxide semiconductor, dust attached to a surface of the gate insulating film 113 is preferably removed by reverse sputtering in which argon is used as a sputtering gas. Note that as a sputtering gas, nitrogen, helium, or the like may be used instead of argon. Alternatively, argon to which oxygen, hydrogen, $N_2O$, $Cl_2$, $CF_4$, or the like is added may be used as a sputtering gas.

Next, an oxide semiconductor film is formed over the gate insulating film 113. The field-effect mobility of a transistor in which an oxide semiconductor is used for a semiconductor layer can be higher than that of a transistor in which amorphous silicon is used for a semiconductor layer. Note that examples of the oxide semiconductor are zinc oxide (ZnO), tin oxide ($SnO_2$), and the like. Moreover, In, Ga, or the like can be added to ZnO.

For the oxide semiconductor film, a thin film represented by the chemical formula, $InMO_3(ZnO)_m$ (m>0) can be used. Note that M denotes one metal element or a plurality of metal elements selected from Ga, Al, Mn, and Co. Specifically, M may be Ga, Ga and Al, Ga and Mn, Ga and Co, or the like.

As the oxide semiconductor film, the following oxide semiconductors can also be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor; an In—O-based oxide semiconductor; a Sn—O-based oxide semiconductor; and a Zn—O-based oxide semiconductor. Further, $SiO_2$ may be contained in the above oxide semiconductor. Here, an In—Ga—Zn—O-based oxide semiconductor means an oxide including indium (In), gallium (Ga), and zinc (Zn), and there is no particular limitation on the stoichiometric proportion. Further, the In—Ga—Zn—O-based oxide semiconductor may contain an element other than In, Ga, and Zn. Furthermore, it is preferable that the energy gap of the oxide semiconductor is 2 eV or more, preferably 2.5 eV or more, more preferably 3 eV or more.

An In—Ga—Zn—O-based film is used as the oxide semiconductor. Here, a target in which $In_2O_3$, $Ga_2O_3$, and ZnO are contained at a molar ratio of 1:1:1 or 1:1:2 is used, and deposition is performed by a sputtering method. The oxide semiconductor is deposited under the following conditions: the distance between the substrate and the target is 100 mm, the pressure is 0.6 Pa, the direct current (DC) power is 0.5 kW, and the atmosphere is an oxygen atmosphere (the proportion of the oxygen flow is 100%). Note that a pulsed direct current (DC) power supply is preferably used because powder substances (also referred to as particles or dust) generated in film deposition can be reduced and the film thickness can be uniform.

In this case, the oxide semiconductor film is preferably formed while remaining moisture in the treatment chamber is removed, in order to prevent hydrogen, hydroxyl group, or moisture from being contained in the oxide semiconductor film.

In order to remove remaining moisture in the treatment chamber, an entrapment vacuum pump is preferably used.

For example, a cryopump, an ion pump, or a titanium sublimation pump is preferably used. The evacuation unit may be a turbo molecular pump provided with a cold trap. In the deposition chamber which is evacuated with the cryopump, a hydrogen atom, a compound containing a hydrogen atom such as water ($H_2O$), and the like are removed, whereby the concentration of an impurity in the oxide semiconductor film formed in the deposition chamber can be reduced.

Figure 3B:
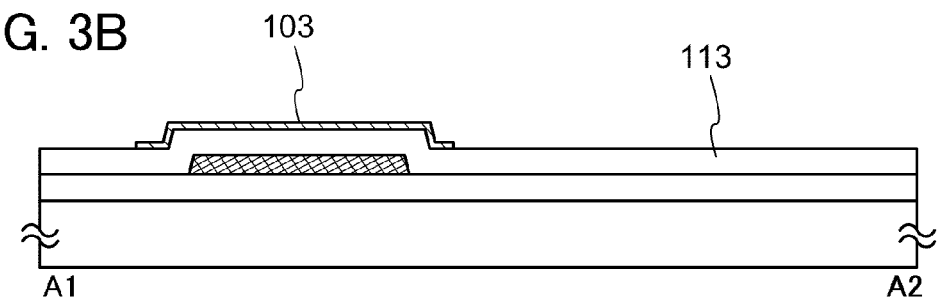

Next, a second photolithography step is performed so that a resist mask is formed and unnecessary portions are removed by etching, whereby the oxide semiconductor layer 103 is formed. The first heat treatment for the oxide semiconductor layer may be performed on the oxide semiconductor film that has not yet been processed into the island-shaped oxide semiconductor layer. FIG. 3B is a cross-sectional view at this stage.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 425° C. and lower than or equal to 750° C. Note that the heat treatment may be performed for one hour or shorter when the temperature of the heat treatment is 425° C. or higher; the heat treatment is preferably performed for one hour or longer when the temperature is lower than 425° C. Here, the substrate is introduced into an electric furnace, which is one of heat treatment apparatuses, and heat treatment is performed on the oxide semiconductor layer in a nitrogen atmosphere. Then, the oxide semiconductor layer is not exposed to air, and a high-purity oxygen gas, a high-purity $N_2O$ gas, or an ultra-dry air (having a dew point of lower than or equal to −40° C., preferably lower than or equal to −60° C.) is introduced into the same furnace and cooling is performed. At this time, it is preferable that water, hydrogen, and the like be not contained in the gas introduced. Alternatively, the purity of the gas which is introduced into the heat treatment apparatus is preferably 6N (99.9999%) or more preferably 7N (99.99999%) or more (that is, the impurity concentration in the gas is 1 ppm or less, or preferably 0.1 ppm or less).

Note that in this specification, heat treatment in the atmosphere of an inert gas such as nitrogen or a rare gas is referred to as heat treatment for dehydration or dehydrogenation. In this specification, dehydrogenation does not indicate elimination of only $H_2$ by heat treatment. For convenience, elimination of H, OH, and the like is called dehydration or dehydrogenation.

The heat treatment apparatus is not limited to an electric furnace. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. Further, the LRTA apparatus may have not only a lamp but also a device for heating an object to be processed by heat conduction or heat radiation from a heater such as a resistance heater. GRTA is a method of heat treatment using a high-temperature gas. As the gas, an inert gas that hardly reacts with an object to be processed by heat treatment, such as nitrogen or a rare gas such as argon is used. The heat treatment may be performed using such an RTA method at higher than or equal to 600° C. and lower than or equal to 750° C. for several minutes.

Further, after the first heat treatment for dehydration or dehydrogenation, heat treatment may be performed at 200° C. to 400° C. inclusive, preferably 200° C. to 300° C. inclusive, in an atmosphere of an oxygen gas or an $N_2O$ gas.

When the oxide semiconductor layer is subjected to heat treatment at 400° C. to 750° C. inclusive, the dehydration or dehydrogenation of the oxide semiconductor layer can be achieved; thus, water ($H_2O$) can be prevented from being contained again in the oxide semiconductor layer later. At the same time of the dehydration or dehydrogenation, an i-type oxide semiconductor layer is changed into an oxygen-deficient oxide semiconductor layer, i.e., an n-type (e.g., $n^-$-type and $n^+$-type) oxide semiconductor layer. When an oxide insulating film which is in contact with the n-type oxide semiconductor layer is formed, the oxide semiconductor layer is brought into an oxygen-excess state. Accordingly, the oxide semiconductor layer becomes an i-type oxide semiconductor layer again so as to have high resistance. The threshold voltage of the transistor using such an oxide semiconductor layer is positive, so that the transistor shows so-called normally-off characteristics. It is preferable for a transistor used in a semiconductor device such as a display device that the gate voltage be a positive threshold voltage that is as close to 0 V as possible. In an active matrix display device, electric characteristics of a transistor included in a circuit are important and the performance of the display device depends on the electrical characteristics. In particular, the threshold voltage of the transistor is important. If the threshold voltage of the transistor is negative, the transistor has so-called normally-on characteristics, that is, current flows between a source electrode and a drain electrode even when the gate voltage is 0 V, so that it is difficult to control the circuit formed using the transistor. In the case of a transistor where the threshold voltage is positive but an absolute value of the threshold voltage is large, the transistor cannot perform a switching operation in some cases because driving voltage is not high enough. In the case of an n-channel transistor, it is preferable that a channel be formed and drain current begin to flow after a positive gate voltage is applied. A transistor in which a channel is not formed unless driving voltage is raised and a transistor in which a channel is formed and drain current flows even when a negative voltage is applied are unsuitable for a transistor used in a circuit.

In the first heat treatment, water, hydrogen, and the like are not preferably contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher.

Here, the oxide semiconductor that is made to be an intrinsic oxide semiconductor or a substantially intrinsic oxide semiconductor (the oxide semiconductor that is highly purified) by removal of impurities such as hydrogen is extremely sensitive to an interface state and an interface electric charge; thus, an interface between the oxide semiconductor and the gate insulating film is important. Therefore, the gate insulating film (GI) that is in contact with the highly-purified oxide semiconductor needs to have higher quality.

For example, by the above-described high-density plasma CVD method using a microwave (2.45 GHz), an insulating film which is dense, has high withstand voltage, and has high quality can be formed. The highly-purified oxide semiconductor and the high-quality gate insulating film are in close contact with each other, whereby the interface state density can be reduced to obtain favorable interface characteristics.

Needless to say, another film formation method such as a sputtering method or a plasma CVD method can be employed as long as the method enables formation of a good-quality insulating film as a gate insulating film. Further, an insulating film whose film quality and characteristic of an interface between the insulating film and an oxide semiconductor are improved by heat treatment which is performed after formation of the insulating film may be formed as a gate insulating film. In any case, any insulating film may be used as long as the insulating film has characteristics of enabling reduction in interface state density of an interface between the insulating film and an oxide semiconductor and formation of a favorable interface as well as having favorable film quality as a gate insulating film.

Further, when an oxide semiconductor containing many impurities is subjected to a gate bias-temperature stress test (BT test) for 12 hours under conditions that the temperature is 85° C. and the voltage applied to the gate is $2 \times 10^6$ V/cm, a bond between the impurity and a main component of the oxide semiconductor is cleaved by a high electric field (B: bias) and a high temperature (T: temperature), and a generated dangling bond induces drift of threshold voltage ($V_{th}$). In contrast, the present invention makes it possible to obtain a thin film transistor which is stable to a BT test by removal of impurities in an oxide semiconductor, especially hydrogen, water, and the like as much as possible to obtain a favorable characteristic of an interface between the oxide semiconductor film and a gate insulating film as described above.

Then, a conductive film is formed from a metal material over the oxide semiconductor film by a sputtering method or a vacuum evaporation method. Examples of a material for the conductive film are an element selected from aluminum, chromium, tantalum, titanium, molybdenum, and tungsten; an alloy containing any of the above elements as its component; and an alloy containing a combination of any of the above elements. Further, in the case where heat treatment is performed at 200° C. to 600° C. inclusive, the conductive film preferably has sufficient heat resistance to withstand heat treatment performed in this temperature range. Since the use of Al alone brings disadvantages such as low heat resistance and a tendency to be corroded, aluminum is used in combination with a conductive material having heat resistance. As such a conductive material having heat resistance, any of the following materials can be used: an element selected from titanium, tantalum, tungsten, molybdenum, chromium, neodymium, and scandium; an alloy containing any of these above elements as its component; an alloy containing a combination of any of these elements; and a nitride containing any of these elements as its component.

Here, the conductive film has a single-layer structure of a titanium film. The conductive film may have a two-layer structure, and a titanium film may be stacked over an aluminum film. Alternatively, the conductive film may have a three-layer structure in which a titanium film, an aluminum film containing neodymium (an Al—Nd film), and a titanium film are stacked in this order. Further alternatively, the conductive film may have a single-layer structure of an aluminum film containing silicon.

Figure 3C:
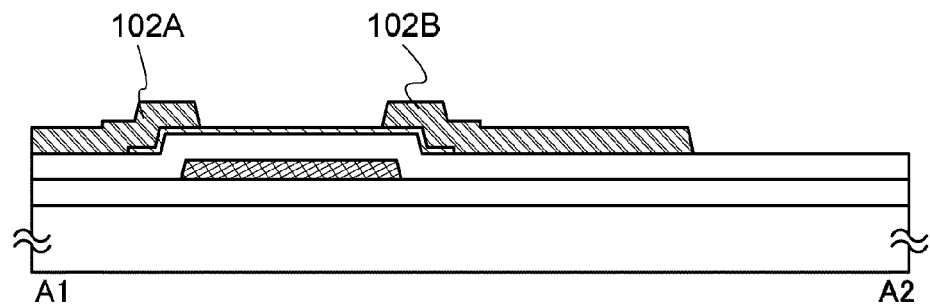

Next, a third photolithography step is performed so that a resist mask is formed and unnecessary portions are removed by etching, whereby the second wiring 102A and the third wiring 102B made of the conductive film are formed. Wet etching or dry etching is employed as an etching method at this time. For example, when a conductive film of titanium is etched with wet etching using an ammonia peroxide mixture (hydrogen peroxide water at 31 wt %:ammonia water at 28 wt %:water=5:2:2), the oxide semiconductor layer 103 can be left while the second wiring 102A and the third wiring 102B are selectively etched. FIG. 3C is a cross-sectional view at this stage.

An exposed region of the oxide semiconductor layer is sometimes etched in the third photolithography step depending on the etching conditions. In this case, the thickness of the oxide semiconductor layer 103 in a region between the second wiring 102A and the third wiring 102B is smaller than that of the oxide semiconductor layer over the first wiring 101 in a region overlapping the second wiring 102A or the third wiring 102B.

Then, the oxide insulating layer 114 is formed over the gate insulating film 113, the oxide semiconductor layer 103, the second wiring 102A, and the third wiring 102B. At this stage, part of the oxide semiconductor layer 103 is in contact with the oxide insulating layer 114.

The oxide insulating layer 114 can be formed to a thickness of at least 1 nm by a method with which impurities such as water and hydrogen are not mixed into the oxide insulating layer as appropriate. In this embodiment, a silicon oxide film is formed by a sputtering method as the oxide insulating layer. The substrate temperature in film deposition is higher than or equal to room temperature and lower than or equal to 300° C., and is 100° C. in this embodiment. The silicon oxide film can be formed by a sputtering method in a rare gas (typically, argon) atmosphere, an oxygen atmosphere, or a mixed atmosphere of a rare gas (typically, argon) and oxygen. As a target for deposition, a silicon oxide target or a silicon target can be used. For example, with the use of a silicon target, a silicon oxide film can be formed by a sputtering method in an atmosphere of oxygen and a rare gas. As the oxide insulating layer which is formed in contact with the oxide semiconductor layer which is changed into an oxygen-deficient type and has low resistance, an inorganic insulating film that does not include impurities such as moisture, a hydrogen ion, and OH⁻ and blocks entry of these impurities from the outside is used. Specifically, a silicon oxide film, a silicon nitride oxide film, an aluminum oxide film, or an aluminum oxynitride film is used. Note that a target for deposition which is doped with phosphorus (P) or boron (B) is used, so that an oxide insulating layer to which phosphorus (P) or boron (B) is added can be formed.

In this embodiment, the oxide insulating layer 114 is formed by a pulsed DC sputtering method using a columnar polycrystalline silicon target doped with boron that has a purity of 6N and a resistivity of 0.01 Ωcm in the following conditions: the distance between the substrate and the target (T-S distance) is 89 mm, the pressure is 0.4 Pa, the direct-current (DC) power is 6 kW, and the atmosphere is an oxygen atmosphere (the oxygen flow rate is 100%). The thickness thereof is 300 nm.

Note that the oxide insulating layer 114 is provided on and in contact with a region serving as the channel formation region of the oxide semiconductor layer and also functions as a channel protective layer.

In this case, the oxide insulating layer 114 is preferably formed while remaining moisture in the treatment chamber is removed, in order to prevent hydrogen, hydroxyl group, or moisture from being contained in the oxide semiconductor layer 103 and the oxide insulating layer 114.

In order to remove remaining moisture in the treatment chamber, an entrapment vacuum pump is preferably used. For example, a cryopump, an ion pump, or a titanium sublimation pump is preferably used. The evacuation unit may be a turbo molecular pump provided with a cold trap. In the deposition chamber which is evacuated with the cryopump, a hydrogen atom, a compound containing a hydrogen atom such as water (H$_2$O), and the like are removed, whereby the concentration of an impurity in the oxide insulating layer 114 formed in the deposition chamber can be reduced.

Next, second heat treatment (preferably at 200° C. to 400° C. inclusive, for example, 250° C. to 350° C. inclusive) is performed in an inert gas atmosphere. For example, the second heat treatment is performed at 250° C. for one hour in a nitrogen atmosphere. By the second heat treatment, heat is applied while part of the oxide semiconductor layer 103 is in contact with the oxide insulating layer 114.

When the second heat treatment is performed while the oxide semiconductor layer 103 which is changed into an oxygen-deficient type at the same time as elimination of hydrogen and the resistance of which is reduced by the first heat treatment is in contact with the oxide insulating layer 114, a region that is in contact with the oxide insulating layer 114 is brought into an oxygen-excess state. Thus, the oxide semiconductor layer 103 is changed into a high-resistance (i-type) oxide semiconductor layer in the depth direction from the region that is in contact with the oxide insulating layer 114.

Further, the heat treatment may be performed at 100° C. to 200° C. inclusive for one hour to 30 hours inclusive in the air. For example, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature. Further, this heat treatment may be performed before formation of the oxide insulating film under a reduced pressure. Under the reduced pressure, the heat treatment time can be shortened. With such heat treatment, hydrogen is introduced from the oxide semiconductor layer to the oxide insulating layer; thus, a normally-off thin film transistor can be obtained. Therefore, reliability of the semiconductor device can be improved.

Then, an opening portion 121 is formed in the oxide insulating layer 114 through a fourth photolithography step and an etching step, and a light-transmitting conductive film is formed. The light-transmitting conductive film is formed using indium oxide (In$_2$O$_3$), indium tin oxide (In$_2$O$_3$—SnO$_2$, hereinafter abbreviated as ITO), or the like by a sputtering method, a vacuum evaporation method, or the like. Alternatively, an Al—Zn—O-based film containing nitrogen, that is, an Al—Zn—O—N-based film, a Zn—O-based film containing nitrogen, or a Sn—Zn—O-based film containing nitrogen may be used. Note that the composition ratio (atomic %) of zinc in the Al—Zn—O—N-based film is less than or equal to 47 atomic % and is higher than that of aluminum in the film; the composition ratio (atomic %) of aluminum in the film is higher than that of nitrogen in the film. Such a material is etched with a hydrochloric acid-based solution. However, since a residue is easily generated particularly in etching ITO, indium zinc oxide (In$_2$O$_3$—ZnO) may be used to improve etching processability.

Note that the unit of the percentage of components in the light-transmitting conductive film is atomic percent (atomic %), and the percentage of components is evaluated by analysis using an electron probe X-ray microanalyzer (EPMA).

Figure 3D:
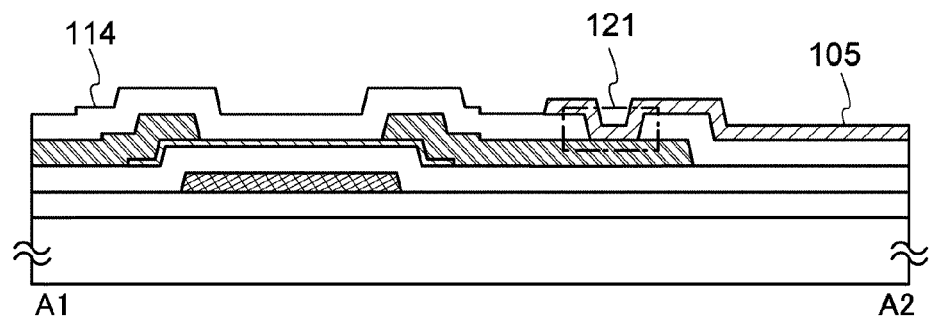

Next, a fifth photolithography step is performed so that a resist mask is formed and unnecessary portions are removed by etching, thereby forming the pixel electrode 105. FIG. 3D is a cross-sectional view at this stage.

In such a manner, the pixel including the thin film transistor 106 with low off-current can be manufactured. Moreover, the pixels are arranged in a matrix to form a pixel portion, whereby one of substrates for manufacturing an active-matrix liquid crystal display device can be obtained. In this specification, such a substrate is referred to as an active-matrix substrate for convenience.

Note that in an active-matrix liquid crystal display device, pixel electrodes arranged in a matrix are driven so that a display pattern is formed on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer. A display element such as a liquid crystal element is provided over the pixel electrode 105.

As described above, the structure described in this embodiment, in which a capacitor is omitted, makes it possible to increase the aperture ratio of a pixel including a thin film transistor in which an oxide semiconductor is used. Thus, a liquid crystal display device can include a high definition display portion.

This embodiment can be implemented in combination with any of the structures described in the other embodiments as appropriate.

Embodiment 2

According to one embodiment of the present invention, impurities to be donors (or acceptors) of carriers in an oxide semiconductor are reduced to a very low level, whereby the oxide semiconductor is made to be intrinsic or substantially intrinsic, and the oxide semiconductor is used for a thin film transistor. In this embodiment, measured values of off-current using a test element group (also referred to as a TEG) will be described below.

Figure 4:
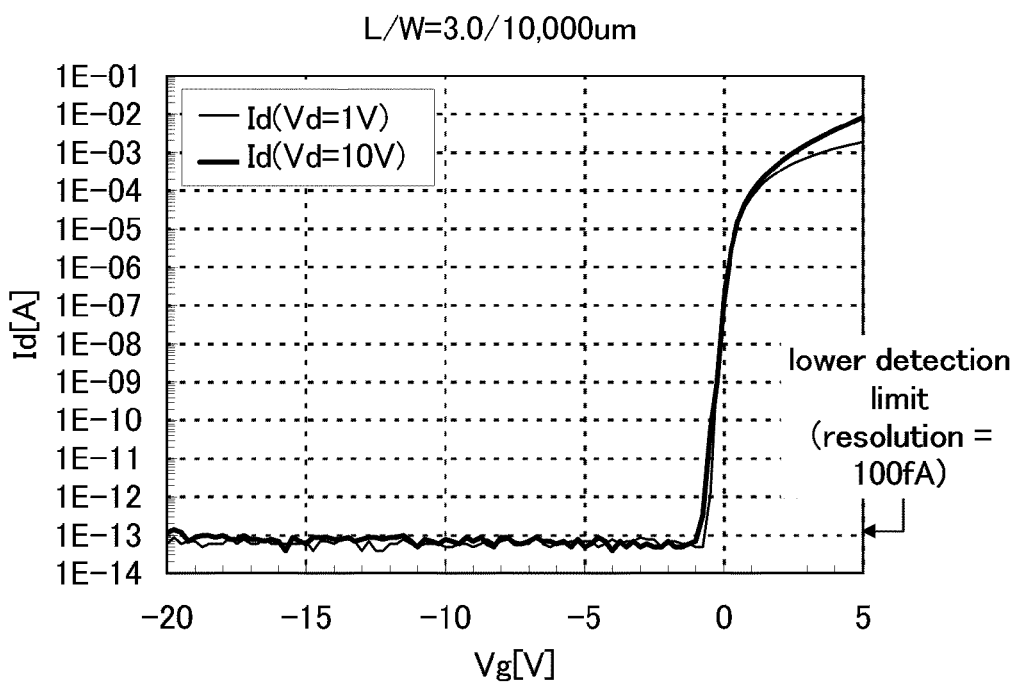
FIG. 4 shows Vg-Id characteristics of a thin film transistor in which an oxide semiconductor is used.
Figure 5A:
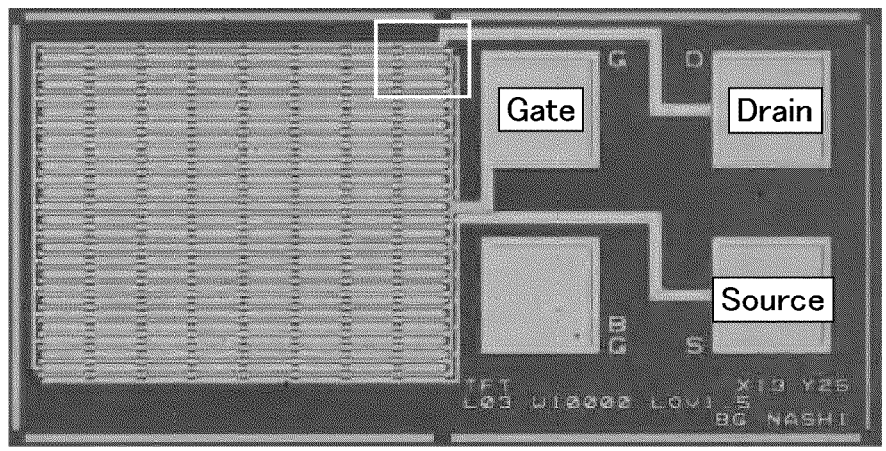
FIGS. 5A and 5B are photographs of a thin film transistor in which an oxide semiconductor is used.
Figure 5B:
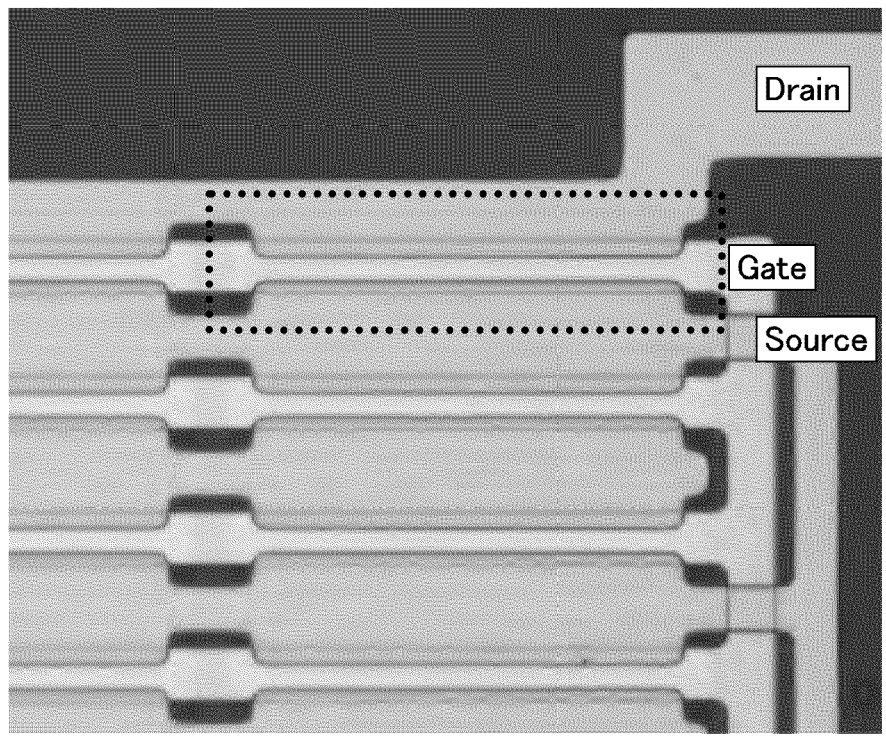

FIG. 4 shows initial characteristics of a thin film transistor with L/W=3 μm/10000 μm in which 200 thin film transistors each with L/W=3 μm/50 μm are connected in parallel. In addition, a top view is shown in FIG. 5A and a partially enlarged top view thereof is show in FIG. 5B. The region enclosed by a dotted line in FIG. 5B is a thin film transistor of one stage with L/W=3 μm/50 μm and Lov=1.5 μm. In order to measure initial characteristics of the thin film transistor, the changing characteristics of the source-drain current (hereinafter referred to as a drain current or Id), i.e., Vg-Id characteristics, were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. Note that FIG. 4 shows Vg in the range of from −20 V to +5 V.

As shown in FIG. 4, the thin film transistor having a channel width W of 10000 μm has an off-current of $1\times10^{-13}$ A or less at Vd of 1 V and 10 V, which is less than or equal to the resolution (100 fA) of a measurement device (a semiconductor parameter analyzer, Agilent 4156C manufactured by Agilent Technologies Inc.).

A method for manufacturing the thin film transistor used for the measurement is described.

First, a silicon nitride film was formed as a base layer over a glass substrate by a CVD method, and a silicon oxynitride film was formed over the silicon nitride film. A tungsten layer was formed as a gate electrode layer over the silicon oxynitride film by a sputtering method. Here, the gate electrode layer was formed by selectively etching the tungsten layer.

Then, a silicon oxynitride film having a thickness of 100 nm was formed as a gate insulating layer over the gate electrode layer by a CVD method.

Then, an oxide semiconductor film having a thickness of 50 nm was formed over the gate insulating layer by a sputtering method using an In—Ga—Zn—O-based metal oxide target (at a molar ratio of $In_2O_3:Ga_2O_3:ZnO=1:1:2$). Here, an island-shaped oxide semiconductor layer was formed by selectively etching the oxide semiconductor film.

Then, first heat treatment was performed on the oxide semiconductor layer in a nitrogen atmosphere in a clean oven at 450° C. for 1 hour.

Then, a titanium layer (having a thickness of 150 nm) was formed as a source electrode layer and a drain electrode layer over the oxide semiconductor layer by a sputtering method. Here, the source electrode layer and the drain electrode layer were formed by selectively etching the titanium layer such that 200 thin film transistors each having a channel length L of 3 μm and a channel width W of 50 μm were connected in parallel to obtain a thin film transistor with L/W=3 μm/10000 μm.

Then, a silicon oxide film having a thickness of 300 nm was formed as a protective insulating layer in contact with the oxide semiconductor layer by a reactive sputtering method. Opening portions were formed over the gate electrode layer, the source electrode layer, and the drain electrode layer by selectively etching the silicon oxide film. After that, second heat treatment was performed in a nitrogen atmosphere at 250° C. for 1 hour.

Then, heat treatment was performed at 150° C. for 10 hours before the measurement of Vg-Id characteristics.

Through the above process, a bottom-gate thin film transistor was manufactured.

The reason why the off-current of the thin film transistor is approximately $1\times10^{-13}$ A as shown in FIG. 4 is that the concentration of hydrogen in the oxide semiconductor layer could be sufficiently reduced in the above manufacturing process. The concentration of hydrogen in the oxide semiconductor layer is $5\times10^{19}$ atoms/cm$^3$ or less, preferably $5\times10^{18}$ atoms/cm$^3$ or less, more preferably $5\times10^{17}$ atoms/cm$^3$ or less. Note that the concentration of hydrogen in the oxide semiconductor layer was measured by secondary ion mass spectrometry (SIMS).

Although the example of using an In—Ga—Zn—O-based oxide semiconductor is described, this embodiment is not particularly limited thereto. As another oxide semiconductor material, a four-component metal oxide film such as an In—Sn—Ga—Zn—O film; a three-component metal oxide film such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide film such as an In—Zn—O film, a Sn—Zn—O film, an Al—Zn—O film, a Zn—Mg—O film, a Sn—Mg—O film, or an In—Mg—O film; an In—O film, a Sn—O film, or a Zn—O film can be used for the oxide semiconductor film. Furthermore, as an oxide semiconductor material, an In—Al—Zn—O-based oxide semiconductor mixed with AlO$_x$ of 2.5 wt % to 10 wt % or an In—Zn—O-based oxide semiconductor mixed with SiO$_x$ of 2.5 wt % to 10 wt % can be used.

The carrier concentration of the oxide semiconductor layer which is measured by a carrier measurement device is preferably less than or equal to $1.45\times10^{10}$/cm$^3$, which is intrinsic carrier concentration of silicon. Specifically, the carrier concentration is $5\times10^{14}$/cm$^3$ or less, preferably $5\times10^{12}$/cm$^3$ or less. In other words, the carrier concentration of the oxide semiconductor layer can be made as close to zero as possible.

The thin film transistor can also have a channel length L of 10 nm to 1000 nm inclusive, which enables an increase in circuit operation speed, and the off-current is extremely small, which enables a further reduction in power consumption.

In addition, in circuit design, the oxide semiconductor layer can be regarded as an insulator when the thin film transistor is in an off state.

After that, the temperature characteristics of off-current of the thin film transistor manufactured in this embodiment were evaluated. Temperature characteristics are important in considering the environmental resistance, maintenance of performance, or the like of an end product in which the thin film transistor is used. It is to be understood that a smaller amount of change is more preferable, which increases the degree of freedom for product designing.

For the temperature characteristics, the Vg-Id characteristics were obtained using a constant-temperature chamber under the conditions where substrates provided with thin film transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 6A:
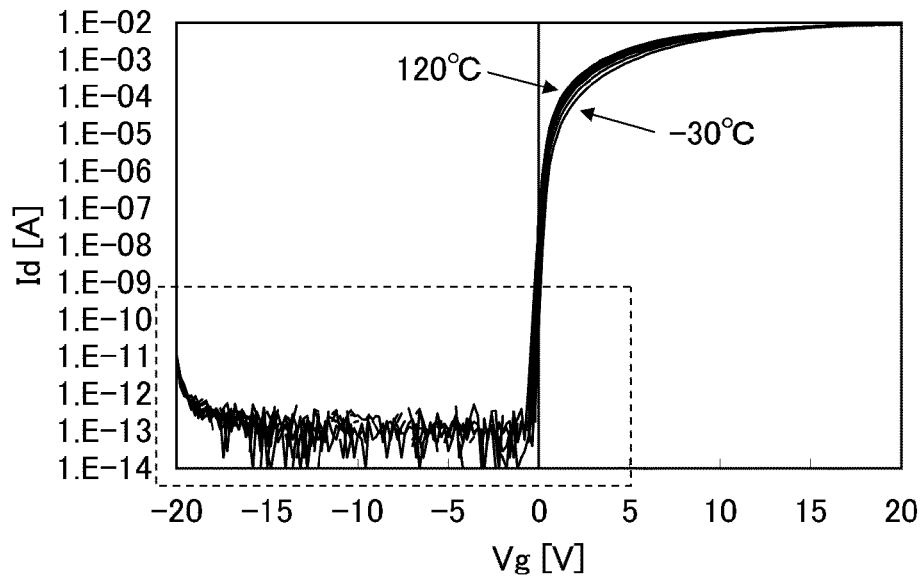
FIGS. 6A and 6B show Vg-Id characteristics (temperature characteristics) of a thin film transistor in which an oxide semiconductor is used.
Figure 6B:
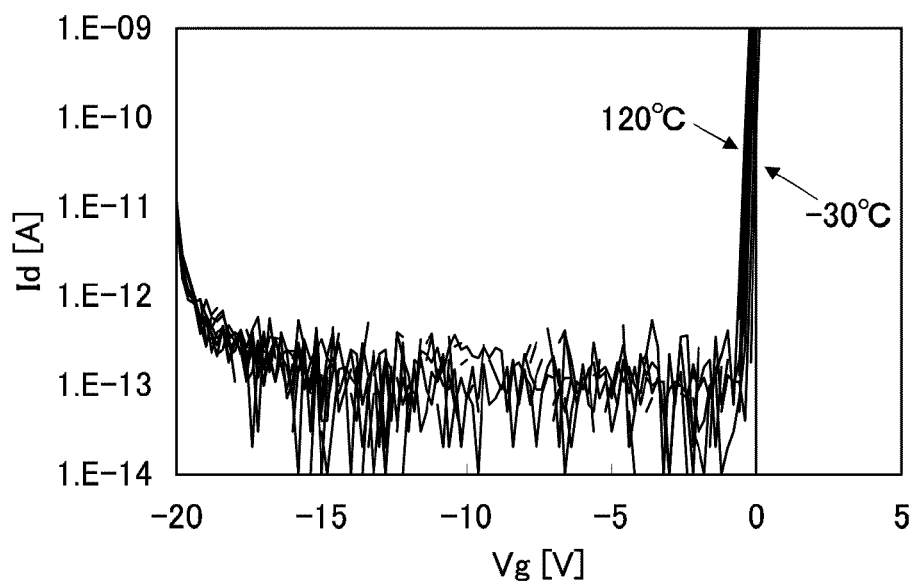

FIG. 6A shows Vg-Id characteristics measured at the above temperatures and superimposed on one another, and FIG. 6B shows an enlarged view of a range of off-current enclosed by a dotted line in FIG. 6A. The rightmost curve indicated by an arrow in the diagram is a curve obtained at −30° C.; the leftmost curve is a curve obtained at 120° C.; and curves obtained at the other temperatures are located therebetween. The temperature dependence of on-currents can hardly be observed. On the other hand, as clearly shown also in the enlarged view of FIG. 6B, the off-currents are less than or equal to $1\times10^{-12}$ A, which is near the resolution of the measurement device, at all temperatures except in the vicinity of a gate voltage of 20 V, and the temperature dependence thereof is not observed. In other words, even at a high temperature of 120° C., the off-current is kept less than or equal to $1\times10^{-12}$ A, and given that the channel width W is 10000 μm, it can be seen that the off-current is significantly small.

A thin film transistor including a purified oxide semiconductor (purified OS) shows almost no dependence of off-current on temperature. It can be said that an oxide semiconductor does not show temperature dependence when purified because the conductivity type becomes extremely close to an intrinsic type and the Fermi level is located in the middle of the forbidden band, as illustrated in the energy band diagram of FIG. 9A. This also results from the fact that the oxide semiconductor has an energy gap of 3 eV or more and includes very few thermally excited carriers. In addition, the source region and the drain region are in a degenerated state, which is also a factor for showing no temperature dependence. The thin film transistor is mainly operated with carriers which are injected from the degenerated source region to the oxide semiconductor, and the above characteristics (independence of off-current on temperature) can be explained by independence of carrier concentration on temperature. Further, this extremely low off-current will be described with reference to energy band diagrams below.

Figure 8:
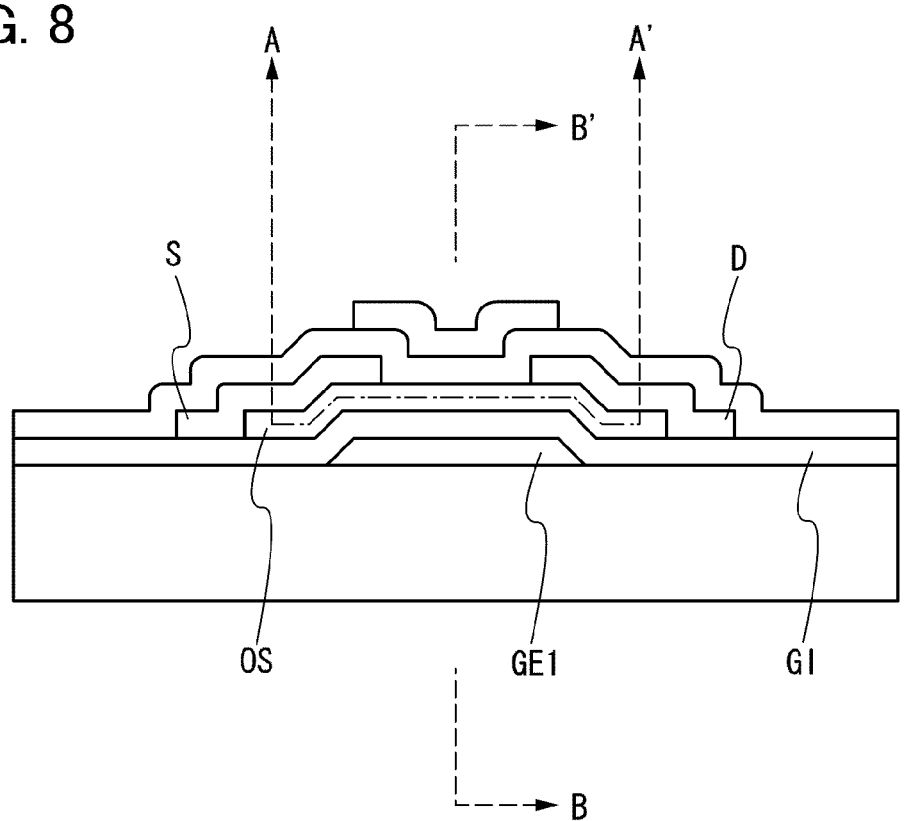
FIG. 8 is a longitudinal sectional view of a thin film transistor having an inverted staggered structure in which an oxide semiconductor is used.

FIG. 8 is a longitudinal sectional view of an inverted staggered thin film transistor in which an oxide semiconductor is used. An oxide semiconductor layer (OS) is provided over a gate electrode (GE1) with a gate insulating film (GI) therebetween, and a source electrode (S) and a drain electrode (D) are provided thereover.

Figure 9A:
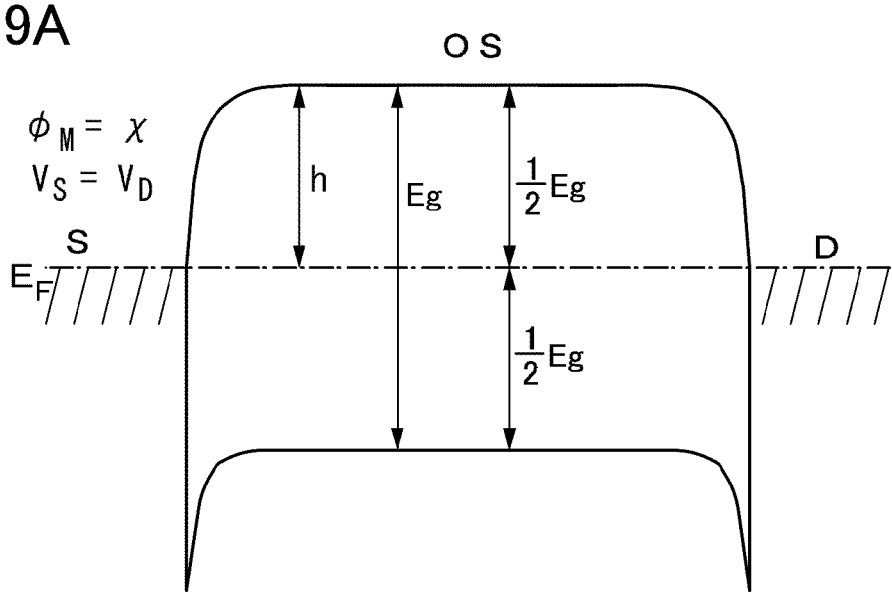
FIGS. 9A and 9B are energy band diagrams (schematic diagrams) along an A-A' section illustrated in FIG. 8.
Figure 9B:
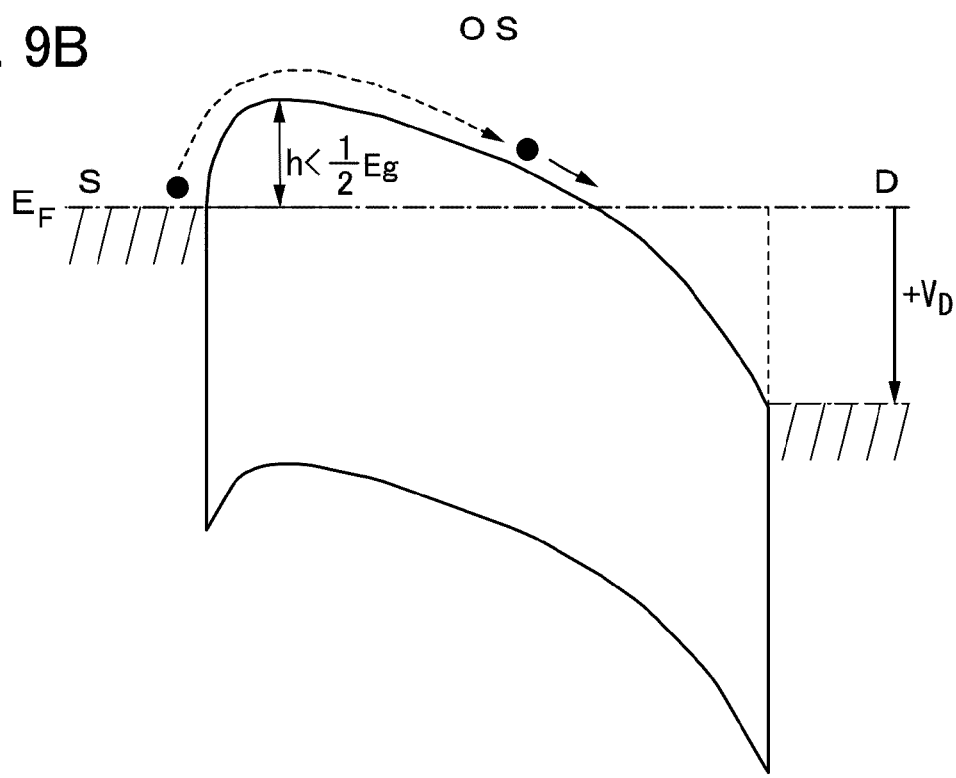

FIGS. 9A and 9B are energy band diagrams (schematic diagrams) along an A-A' section illustrated in FIG. 8. FIG. 9A shows a case where the source and the drain have voltage of the same potential ($V_D=0$ V). FIG. 9B shows a case where positive potential is applied to the drain ($V_D>0$ V) whereas positive potential is not applied to the source.

Figure 10A:
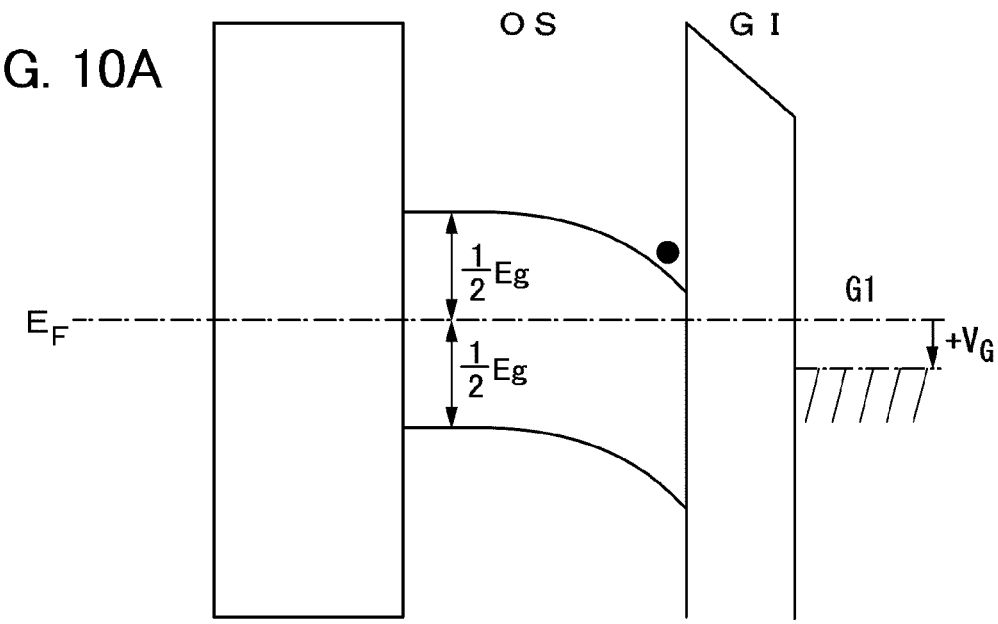
FIGS. 10A and 10B are energy band diagrams (schematic diagrams) along a B-B' section illustrated in FIG. 8.
Figure 10B:
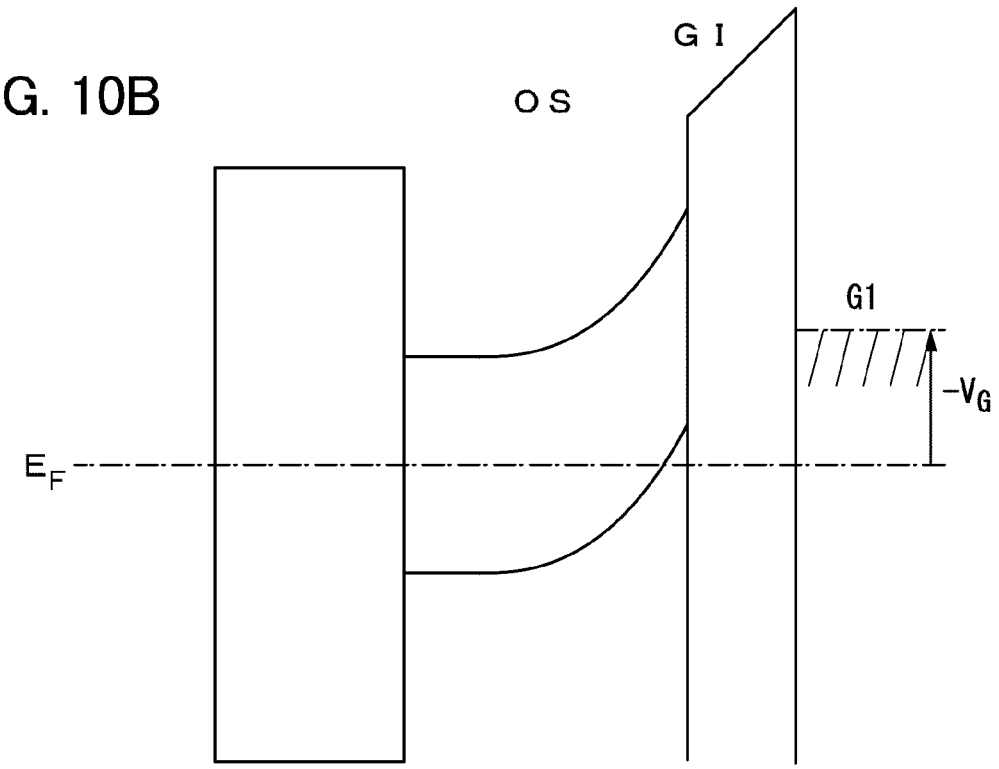

FIGS. 10A and 10B are energy band diagrams (schematic diagrams) along a B-B' section illustrated in FIG. 8. FIG. 10A shows a state where positive potential ($+V_G$) is applied to a gate (G1), that is, a case where the thin film transistor is in an on state where carriers (electrons) flow between the source and the drain. FIG. 10B shows a state where negative potential ($-V_G$) is applied to the gate (G1), that is, a case where the thin film transistor is in an off state (where minority carriers do not flow).

FIG. 11 shows relation between the vacuum level and the work function of a metal ($\phi_M$) and relation between the vacuum level and the electron affinity ($\chi$) of an oxide semiconductor.

At normal temperature, electrons in the metal degenerate and the Fermi level is positioned in the conduction band. On the other hand, a conventional oxide semiconductor is generally of n-type, and the Fermi level ($E_F$) in that case is positioned closer to the conduction band and is away from the intrinsic Fermi level ($E_i$) that is located in the middle of the band gap. Note that it is known that some hydrogen in the oxide semiconductor form a donor and might be a factor that causes an oxide semiconductor to be an n-type oxide semiconductor.

In contrast, the oxide semiconductor according to the present invention is an oxide semiconductor that is made to be an intrinsic (i-type) semiconductor or made to be as close to an intrinsic semiconductor as possible by being highly purified not by addition of an impurity but by removal of hydrogen that is an n-type impurity so that as few impurities, which are not main components of the oxide semiconductor, as possible are contained. In other words, the oxide semiconductor according to the present invention has a feature in that it is made to be an i-type (intrinsic) semiconductor or made to be close thereto by being highly purified by removal of impurities such as hydrogen or water as much as possible. As a result, the Fermi level ($E_F$) can be at the same level as the intrinsic Fermi level ($E_i$).

It is said that the electron affinity ($\chi$) of an oxide semiconductor is 4.3 eV in the case where the band gap (Eg) thereof is 3.15 eV. The work function of titanium used for forming the source and drain electrodes is substantially equal to the electron affinity ($\chi$) of the oxide semiconductor. In the case where titanium is used for the source and drain electrodes, the Schottky electron barrier is not formed at an interface between the metal and the oxide semiconductor.

In other words, an energy band diagram (a schematic diagram) like FIG. 9A is obtained in the case where a metal and an oxide semiconductor are in contact with each other when the work function of the metal ($\phi_M$) and the electron affinity ($\chi$) of the oxide semiconductor are substantially equal.

In FIG. 9B, a black circle (•) represents an electron. When positive potential is applied to the drain, the electron is injected into the oxide semiconductor over the barrier (h) and flows toward the drain. In that case, the height of the barrier (h) changes depending on the gate voltage and the drain voltage. In the case where positive drain voltage is applied, the height of the barrier (h) is smaller than the height of the barrier (h) in FIG. 9A of the case where no voltage is applied; that is, the height of the barrier (h) is smaller than half of the band gap (Eg).

In this case, as shown in FIG. 9A, the electron moves along the lowest part of the oxide semiconductor, which is energetically stable, at an interface between the gate insulating film and the highly-purified oxide semiconductor.

In FIG. 9B, when negative potential (reverse bias) is applied to the gate (G1), the number of holes that are minority carriers is substantially zero; thus, the current value becomes a value as close to zero as possible.

For example, even when the thin film transistor has a channel width W of $1\times10^4$ μm and a channel length of 3 μm, an off-current of $10^{-13}$ A or less and a subthreshold value (S value) of 0.1 V/dec. (the thickness of the gate insulating film: 100 nm) can be obtained.

Figure 19:
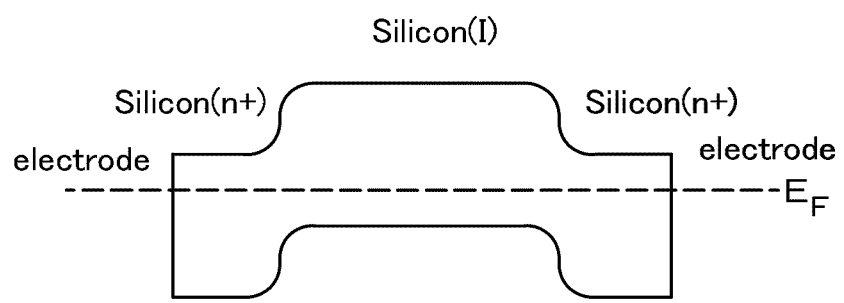
FIG. 19 illustrates a band structure between a source and a drain of a silicon MOS transistor.

FIG. 19 is a band structure of a transistor formed using a silicon semiconductor. The intrinsic carrier concentration of a silicon semiconductor is $1.45\times10^{10}/cm^3$ (300 K) and carriers exist even at room temperature. This means that thermally excited carriers exist even at room temperature. A silicon wafer to which an impurity such as phosphorus or boron is added is used practically. Therefore, in practice, $1\times10^{14}/cm^3$ or more carriers exist in a silicon semiconductor, and the carriers contribute to conduction between the source and the drain. Furthermore, the band gap of a silicon semiconductor is 1.12 eV, and thus the off-current of a transistor including a silicon semiconductor significantly changes depending on temperature.

Therefore, not by simply using an oxide semiconductor having a wide band gap for a transistor but by highly purifying the oxide semiconductor such that an impurity other than a main component can be prevented from being contained therein as much as possible so that the carrier concentration becomes $1\times10^{14}/cm^3$ or less, preferably $1\times10^{12}/cm^3$ or less, carriers to be thermally excited at a practical operation temperature can be eliminated, and the transistor can operate only with carriers that are injected from the source side. This makes it possible to decrease the off-current to $1\times10^{-13}$ A or less and to obtain a transistor whose off-current hardly changes with a change in temperature and which is capable of extremely stable operation.

In the case where a memory circuit (memory element) or the like is manufactured using a thin film transistor having such an extremely small off-current, there is very little leakage. Therefore, memory data can be stored for a longer period of time. Similarly in a liquid crystal display device and the like, leakage from a storage capacitor through a thin film transistor can be suppressed; therefore, a potential of a pixel can be held only by a liquid crystal capacitor, without an auxiliary capacitor.

This embodiment can be implemented in combination with any of the structures described in the other embodiments as appropriate.

Embodiment 3

In this embodiment, a structure and operation of a pixel that can be applied to a liquid crystal display device will be described.

Figure 12A:
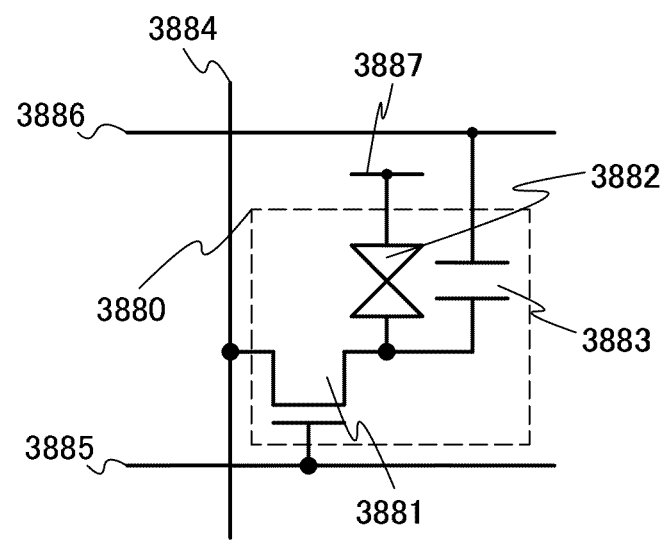
FIGS. 12A and 12B each illustrate a liquid crystal display device.

FIG. 12A illustrates an example of a pixel configuration that can be applied to a liquid crystal display device. A pixel 3880 includes a transistor 3881, a liquid crystal element 3882, and a capacitor 3883. A gate of the transistor 3881 is electrically connected to a wiring 3885. A first terminal of the transistor 3881 is electrically connected to a wiring 3884.

A second terminal of the transistor 3881 is electrically connected to a first terminal of the liquid crystal element 3882. A second terminal of the liquid crystal element 3882 is electrically connected to a wiring 3887. A first terminal of the capacitor 3883 is electrically connected to the first terminal of the liquid crystal element 3882. A second terminal of the capacitor 3883 is electrically connected to a wiring 3886.

The wiring 3884 can function as a signal line. The signal line is a wiring for transmitting a signal voltage, which is input from the outside of the pixel, to the pixel 3880. The wiring 3885 can function as a scan line. The scan line is a wiring for controlling on/off of the transistor 3881. The wiring 3886 can function as a capacitor line. The capacitor line is a wiring for applying a predetermined voltage to the second terminal of the capacitor 3883. The transistor 3881 can function as a switch. The capacitor 3883 can function as an auxiliary capacitor. The capacitor is an auxiliary capacitor with which the signal voltage continues to be applied to the liquid crystal element 3882 even when the switch is off. The wiring 3887 can function as a counter electrode. The counter electrode is a wiring for applying a predetermined voltage to the second terminal of the liquid crystal element 3882. Note that a function of each wiring is not limited to the above, and each wiring can have a variety of functions. For example, by changing a voltage applied to the capacitor line, a voltage applied to the liquid crystal element can be adjusted.

Figure 12B:
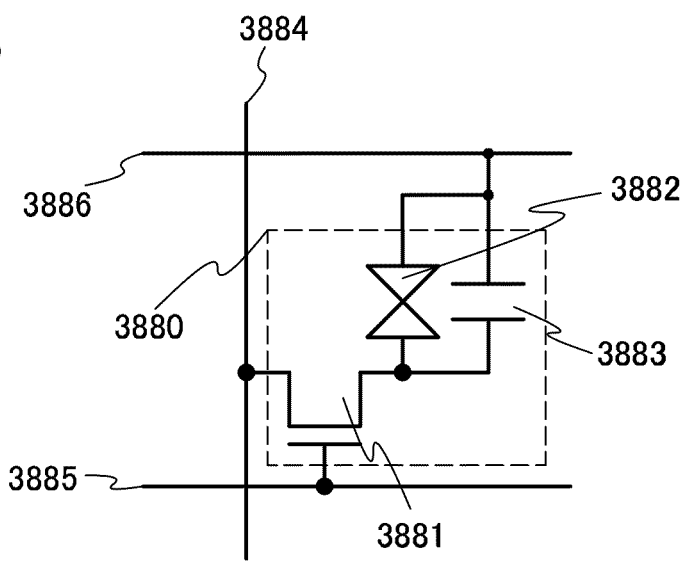

FIG. 12B illustrates another example of a pixel configuration that can be applied to a liquid crystal display device. The example of the pixel configuration in FIG. 12B is the same as that in FIG. 12A, except that the wiring 3887 is omitted and the second terminal of the liquid crystal element 3882 and the second terminal of the capacitor 3883 are electrically connected to each other. The example of the pixel configuration in FIG. 12B can be applied particularly to the case of using a liquid crystal element with a horizontal electric field mode (including an IPS mode and FFS mode). This is because in the horizontal electric field mode liquid crystal element, the second terminal of the liquid crystal element 3882 and the second terminal of the capacitor 3883 can be formed over one substrate, and thus it is easy to electrically connect the second terminal of the liquid crystal element 3882 and the second terminal of the capacitor 3883. With the pixel configuration in FIG. 12B, the wiring 3887 can be omitted, whereby a manufacturing process can be simplified and manufacturing cost can be reduced.

Figure 13A:
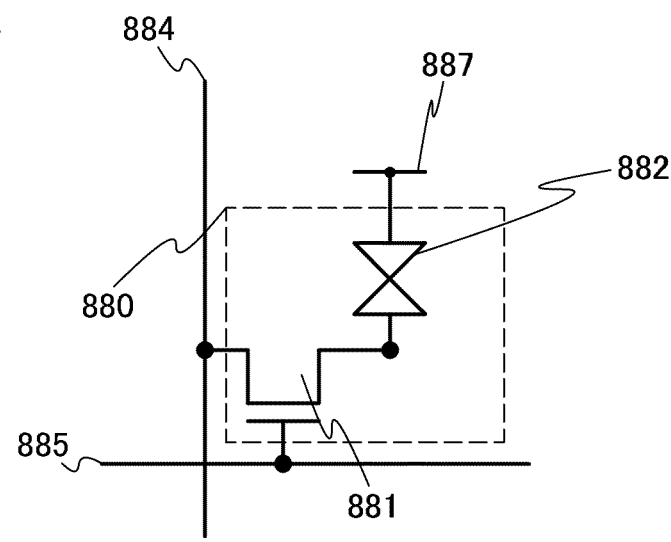
FIGS. 13A and 13B each illustrate a liquid crystal display device.
Figure 13B:
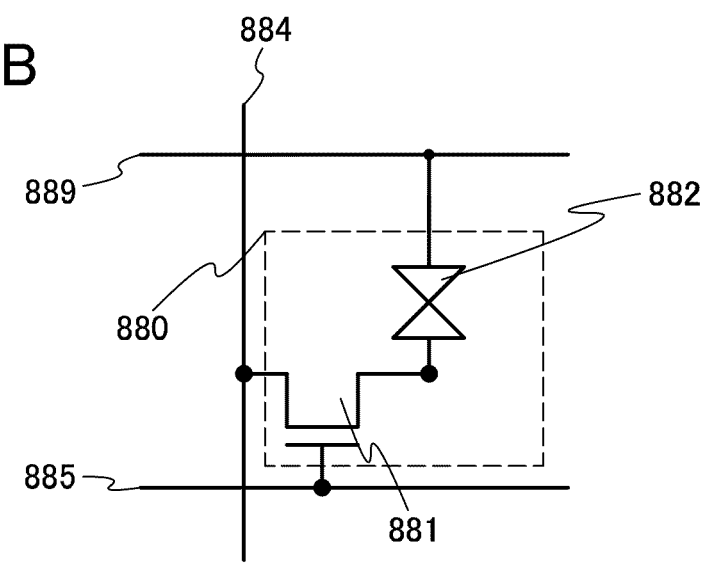

Here, a pixel portion including the thin film transistor described in Embodiment 1 is illustrated in FIGS. 13A and 13B. FIG. 13A illustrates a structure in which the capacitor 3883 is omitted from the structure illustrated in FIG. 12A. In addition, FIG. 13B is a structure in which the capacitor 3883 is omitted from the structure illustrated in FIG. 12B, and the second terminal of the liquid crystal element is connected to a common wiring 889. As described in Embodiment 2, when a thin film transistor with sufficiently low off-current is used, a potential can be held only by a liquid crystal capacitor, without a capacitor (an auxiliary capacitor) which is parallel to a liquid crystal element. Needless to say, a capacitor may be provided similarly to the above-described comparative example, and the size thereof can be reduced. Further, a capacitance of an auxiliary capacitor which is smaller than a capacitance of a liquid crystal element may be formed. In this embodiment, a pixel configuration in which a capacitor is omitted is described below.

Figure 14A:
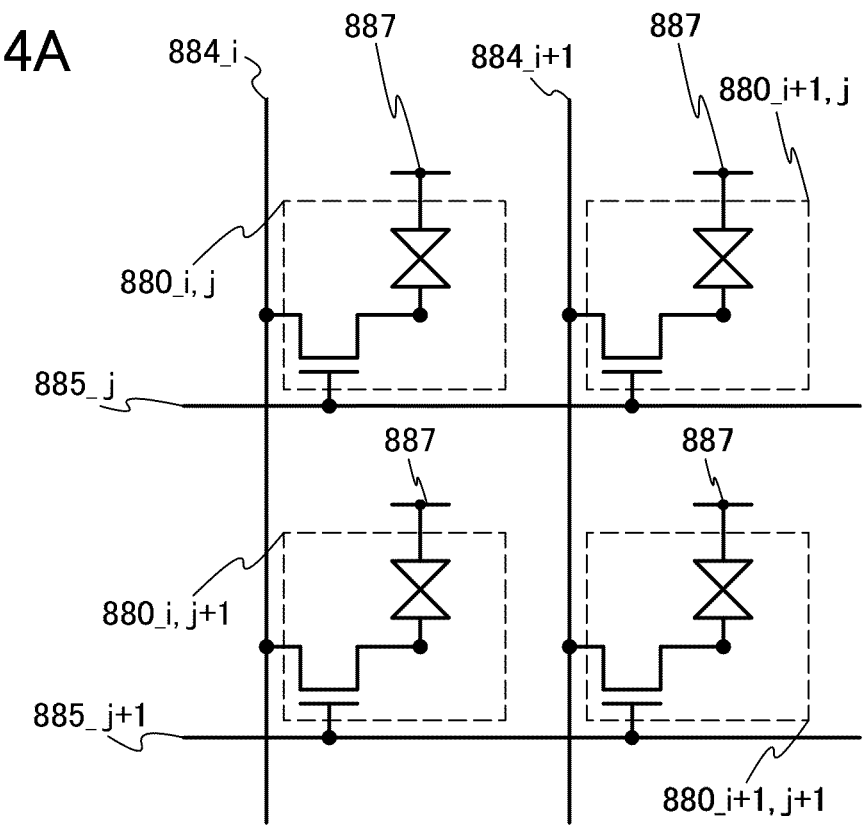
FIGS. 14A and 14B illustrate a liquid crystal display device.

FIG. 14A illustrates a circuit configuration in the case where a plurality of pixels with the structure illustrated in FIG. 13A is arranged in a matrix. FIG. 14A is a circuit diagram illustrating four pixels among a plurality of pixels included in the display portion. A pixel placed in an i-th column and a j-th row (i and j are each a natural number) is represented as a pixel 880_$i,j$, and a wiring 884_$i$ and a wiring 885_$j$ are electrically connected to the pixel 880_$i, j$. Similarly, a pixel 880_$i$+1, j is electrically connected to a wiring 884_$i$+1 and the wiring 885_$j$. Similarly, a pixel 880_$i, j$+1 is electrically connected to the wiring 884_$i$ and a wiring 885_$j$+1. Similarly, a pixel 880_$i$+1, j+1 is electrically connected to the wiring 884_$i$+1 and the wiring 885_$j$+1. Note that each of the wirings can be shared with a plurality of pixels in the same column or the same row. In the pixel configuration in FIG. 14A, the wiring 887 is a counter electrode. Since the counter electrode is common to all the pixels, the wiring 887 is not indicated by the natural number i or j. Further, since the pixel configuration in FIG. 13B can also be used, the wiring 887 is not essential even in a structure where the wiring 887 is provided, and the wiring 887 can be omitted when another wiring serves as the wiring 887, for example.

Figure 14B:
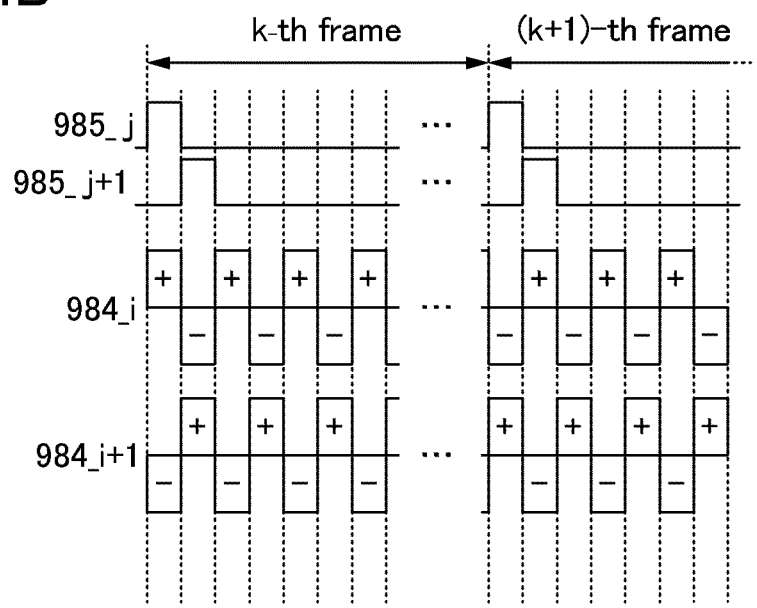

The pixel configuration in FIG. 14A can be driven by a variety of methods. In particular, when the pixels are driven by a method called alternating-current driving, degradation (burn-in) of the liquid crystal element can be suppressed. FIG. 14B is a timing chart of voltages applied to each wiring in the pixel configuration in FIG. 14A in the case where dot inversion driving which is a kind of alternating-current driving is performed. By the dot inversion driving, flickers seen when the alternating-current driving is performed can be suppressed. Note that FIG. 14B illustrates a signal 985_$j$ input to the wiring 885_$j$, a signal 985_$j$+1 input to the wiring 885_$j$+1, a signal 984_$i$ input to the wiring 884_$i$, and a signal 984_$i$+1 input to the wiring 884_$i$+1.

In the pixel configuration in FIG. 14A, a switch in a pixel electrically connected to the wiring 885_$j$ is brought into a selection state (an on state) in a j-th gate selection period in one frame period, and brought into a non-selection state (an off state) in the other periods. Then, a (j+1)-th gate selection period is provided after the j-th gate selection period. By performing sequential scanning in this manner, all the pixels are sequentially selected in one frame period. In the timing chart in FIG. 14B, the switch in the pixel is brought into a selection state when the voltage is set to high level, and the switch is brought into a non-selection state when the voltage is set to low level.

In the timing chart in FIG. 14B, in the j-th gate selection period in a k-th frame (k is a natural number), a positive signal voltage is applied to the wiring 884_$i$ used as a signal line, and a negative signal voltage is applied to the wiring 884_$i$+1. Then, in the (j+1)-th gate selection period in the k-th frame, a negative signal voltage is applied to the wiring 884_$i$, and a positive signal voltage is applied to the wiring 884_$i$+1. After that, signals whose polarity is reversed in each gate selection period are alternately supplied to each of the signal lines. Thus, in the k-th frame, the positive signal voltage is applied to the pixel 880$i, j$ and the pixel 880_$i$+1, j+1, and the negative signal voltage is applied to the pixel 880_$i$+1, j and the pixel 880_$i, j$+1. Then, in a (k+1)-th frame, a signal voltage whose polarity is opposite to that of the signal voltage written in the k-th frame is written to each pixel. Thus, in the (k+1)-th frame, the positive signal voltage is applied to the pixel 880_$i$+1, j and the pixel 880_$i, j$+1, and the negative signal voltage is applied to the pixel 880_$i, j$ and the pixel 880_$i$+1, j+1. The dot inversion driving is a driving method in which signal voltages whose polarity is different between adjacent pixels are applied in one frame and the polarity of the signal voltage for one pixel is reversed in each frame as described above. By the dot inversion driving, flickers seen when the entire or part of an image to be displayed is uniform can be reduced while degradation of the liquid crystal element is suppressed. Although only the polarity of the signal voltages for the wirings 884 is shown in the timing chart, the signal voltages can actually have a variety of values in the polarity shown. Here, the case where the polarity is reversed per dot (per pixel) is described; the polarity can be reversed per a plurality of pixels without limitation to the above. For example, when the polarity of signal voltages to be written is reversed per two gate selection periods, power consumed by writing the signal voltages can be reduced. Alternatively, the polarity can be reversed per column (source line inversion) or per row (gate line inversion).

In this case, so-called overdriving may be performed in which an overdrive voltage is applied to the pixel portion and the response speed of the liquid crystal element is increased to suppress blur. Thus, when a moving image is displayed, the movement thereof can be displayed clearly.

Specifically, in the case where a capacitor which is parallel to a liquid crystal element is not provided as in one embodiment of the present invention, there are cases where after writing data to the pixel, dielectric constant is changed in accordance with a change in a state of liquid crystal and a capacitance of the liquid crystal itself is changed, whereby a potential held by the pixel is changed; therefore, overdriving is an effective driving method.

Figure 15A:
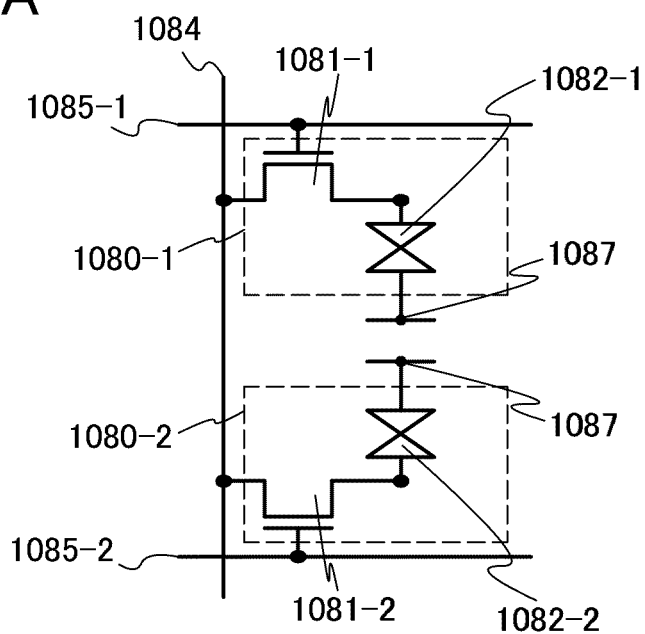
FIGS. 15A and 15B each illustrate a liquid crystal display device.
Figure 15B:
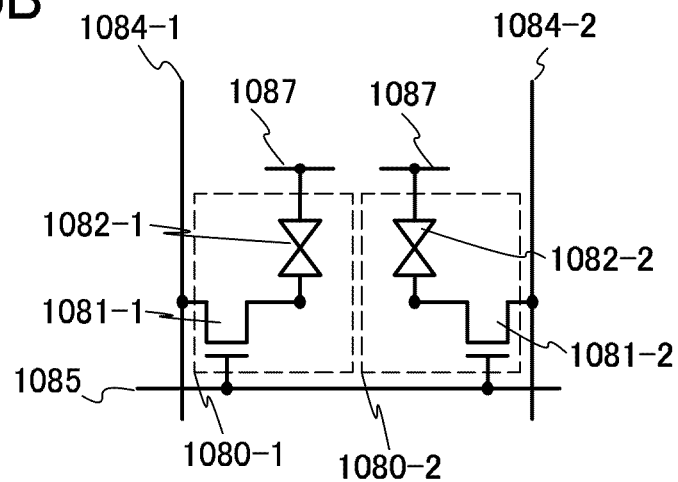

Next, a pixel configuration and a driving method that are preferably used particularly by a liquid crystal element with a vertical alignment (VA) mode typified by an MVA mode or a PVA mode will be described. The VA mode has advantages that a rubbing process is not necessary in manufacturing, the amount of light leakage is small in displaying black images, the level of drive voltage is low, and the like; however, the VA mode has a problem in that the quality of images deteriorates when a screen is viewed from an angle (i.e., the viewing angle is small). In order to increase the viewing angle in the VA mode, a pixel configuration in which one pixel includes a plurality of subpixels as illustrated in FIGS. 15A and 15B is effective. Pixel configurations illustrated in FIGS. 15A and 15B are examples of the case where a pixel includes two subpixels (a first subpixel 1080-1 and a second subpixel 1080-2). Note that the number of subpixels in one pixel is not limited to two and can be other numbers. As the number of subpixels becomes larger, the viewing angle can be further increased. A plurality of subpixels can have the same circuit configuration. Here, the case is described in which all the subpixels have the circuit configuration in FIG. 13A. The first subpixel 1080-1 includes a transistor 1081-1 and a liquid crystal element 1082-1. The connection relation is the same as that in the circuit configuration in FIG. 13A. Similarly, the second subpixel 1080-2 includes a transistor 1081-2 and a liquid crystal element 1082-2. The connection relation is the same as that in the circuit configuration in FIG. 13A.

The pixel configuration in FIG. 15A includes, for two subpixels included in one pixel, two wirings 1085 (a wiring 1085-1 and a wiring 1085-2) used as scan lines and one wiring 1084 used as a signal line. When the signal line is shared with two subpixels in such a manner, the aperture ratio can be increased. Further, a signal line driver circuit can be simplified, so that manufacturing cost can be reduced. Moreover, the number of connections between a liquid crystal panel and a driver circuit IC can be reduced, so that the yield can be increased. The pixel configuration in FIG. 15B includes, for two subpixels included in one pixel, one wiring 1085 used as a scan line and two wirings 1084 (a wiring 1084-1 and a wiring 1084-2) used as signal lines. When the scan line is shared with two subpixels in such a manner, the aperture ratio can be increased. Further, the total number of scan lines can be reduced, so that one gate line selection period per pixel can be sufficiently long even in a high-definition liquid crystal panel, and an appropriate signal voltage can be written to each pixel.

Figure 16A:
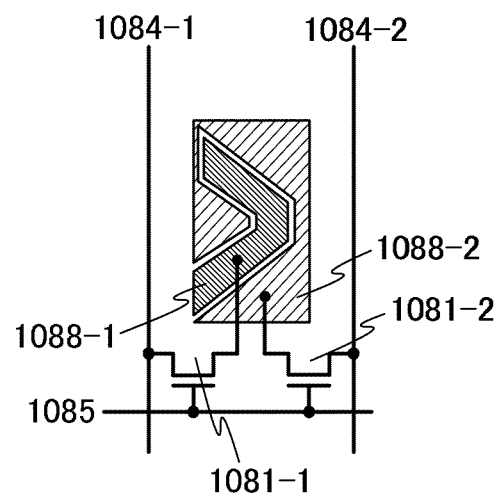
FIGS. 16A and 16B each illustrate a liquid crystal display device.
Figure 16B:
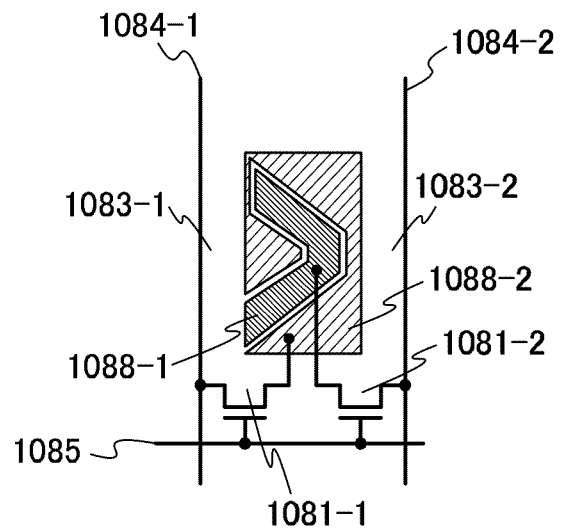

FIGS. 16A and 16B each schematically illustrate an example of electrical connection of elements in the case where the liquid crystal element in the pixel configuration in FIG. 15B is replaced with the shape of a pixel electrode. In FIG. 16A, a first pixel electrode 1088-1 corresponds to a first terminal of the liquid crystal element 1082-1 in FIG. 15B, and a second pixel electrode 1088-2 corresponds to a first terminal of the liquid crystal element 1082-2 in FIG. 15B. That is, the first pixel electrode 1088-1 is electrically connected to one of a source and a drain of the transistor 1081-1, and the second pixel electrode 1088-2 is electrically connected to one of a source and a drain of the transistor 1081-2. In FIG. 16B, the connection relation between the pixel electrode and the transistor is opposite to that in FIG. 16A. That is, the first pixel electrode 1088-1 is electrically connected to one of the source and the drain of the transistor 1081-2, and the second pixel electrode 1088-2 is electrically connected to one of the source and the drain of the transistor 1081-1. Although not illustrated, each pixel electrode is connected to a counter electrode through liquid crystal to form a liquid crystal element.

Next, an estimate of how much the aperture ratio of each pixel in a liquid crystal display device is increased by using a thin film transistor including an oxide semiconductor layer according to one embodiment of the present invention is shown.

Parameters for estimating the aperture ratio of a pixel are as follows: the leakage current of the thin film transistor including the oxide semiconductor layer is $1 \times 10^{-13}$ (A), the panel size is 3.4 inches, the grayscale to be expressed is 256 gray levels, a voltage input is 10 V, and one frame for display is 1/60 second. Moreover, a gate insulating film has a dielectric constant of 3.7 (F/m) and a thickness of $1 \times 10^{-7}$ (m).

First, the area of a capacitor and the aperture ratio in the case where the above-described parameters apply to a panel (referred to as a first panel) in which the number of pixels is 540×RGB×960 are estimated. The size of the pixel in the panel is 26 (μm)×78 (μm), that is, $2.03 \times 10^{-9}$ (m$^2$). The area other than a region occupied by a wiring and a thin film transistor is $1.43 \times 10^{-9}$ (m$^2$), and the area of the region occupied by the wiring and the thin film transistor is $6.00 \times 10^{-10}$ (m$^2$).

In the first panel, a minimum necessary capacitance of an auxiliary capacitor is $4.25 \times 10^{-14}$ (F) in a pixel having a thin film transistor including an oxide semiconductor layer. In this case, the area necessary for the capacitor is $1.30 \times 10^{10}$ (m$^2$); the capacitor accounts for 6.4% of the area of the pixel and the aperture ratio is 64.0%.

In addition, the area of a capacitor and the aperture ratio in the case where the above-described parameters apply to a panel (referred to as a second panel) in which the number of pixels is 480×RGB×640 are estimated. The size of a pixel in the panel is 36 (μm)×108 (μm), that is, $3.89 \times 10^{-9}$ (m$^2$). The area excluding a region occupied by a wiring and a thin film transistor is $3.29 \times 10^{-9}$ (m$^2$), and the area of the region occupied by the wiring and the thin film transistor is $6.00 \times 10^{-10}$ (m$^2$).

In the second panel, a minimum necessary capacitance of an auxiliary capacitor is $4.25 \times 10^{-14}$ (F) in a pixel having a thin film transistor including an oxide semiconductor layer. In this case, the area necessary for the capacitor is $1.30 \times 10^{-10}$ (m$^2$); the capacitor accounts for 3.3% of the area of the pixel and the aperture ratio is 81.2%.

When a thin film transistor including an oxide semiconductor layer according to one embodiment of the present invention is used for the first panel and the second panel, a capacitor line can be reduced and the region occupied by the pixel electrode 105 can be increased. The calculated aperture ratio in the first panel is 70.4% and that in the second panel is 84.5%; therefore, it is found that the aperture ratio is significantly increased by omitting a capacitor.

By a combination of the pixel in this embodiment with the structure in Embodiment 1 or 2, the aperture ratio can be increased when the pixel including a thin film transistor in which an oxide semiconductor is used is formed.

This embodiment can be implemented in combination with any of the structures described in the other embodiments as appropriate.

Embodiment 4

In this embodiment, an example of an electronic device including the liquid crystal display device described in any of Embodiments 1 to 3 will be described.

FIG. 17A illustrates a portable game machine that can include a housing 9630, a display portion 9631, speakers 9633, operation keys 9635, a connection terminal 9636, a recording medium reading portion 9672, and the like. The portable game machine in FIG. 17A can have a function of reading a program or data stored in the recording medium to display it on the display portion, a function of sharing information with another portable game machine by wireless communication, and the like. Note that the portable game machine in FIG. 17A can have a variety of functions without being limited to the above.

FIG. 17B illustrates a digital camera that can include the housing 9630, the display portion 9631, the speakers 9633, the operation keys 9635, the connection terminal 9636, a shutter button 9676, an image receiving portion 9677, and the like. The digital camera having a television reception function in FIG. 17B can have various functions such as a function of photographing a still image and/or a moving image; a function of automatically or manually correcting the photographed image; a function of obtaining various kinds of information through an antenna; a function of storing the photographed image or the information obtained through the antenna; and a function of displaying the photographed image or the information obtained through the antenna on the display portion. Note that the digital camera having the television reception function in FIG. 17B can have a variety of functions without being limited to the above.

FIG. 17C illustrates a television set that can include the housing 9630, the display portion 9631, the speakers 9633, the operation keys 9635, the connection terminal 9636, and the like. The television set in FIG. 17C can have a function of converting an electric wave for television into an image signal, a function of converting the image signal into a signal suitable for display, a function of converting a frame frequency of the image signal, and the like. Note that the television set in FIG. 17C can have a variety of functions without being limited to the above.

Figure 18A:
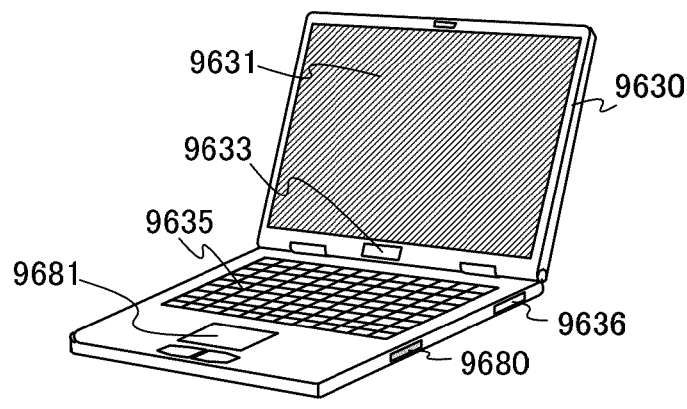
FIGS. 18A to 18C each illustrate an electronic device.

FIG. 18A illustrates a computer that can include the housing 9630, the display portion 9631, the speaker 9633, the operation keys 9635, the connection terminal 9636, a pointing device 9681, an external connection port 9680, and the like. The computer in FIG. 18A can have a function of displaying a variety of information (e.g., a still image, a moving image, and a text image) on the display portion, a function of controlling processing by a variety of software (programs), a communication function such as wireless communication or wired communication, a function of being connected to various computer networks with the communication function, a function of transmitting or receiving a variety of data with the communication function, and the like. Note that the computer in FIG. 18A is not limited to having these functions and can have a variety of functions.

Figure 18B:
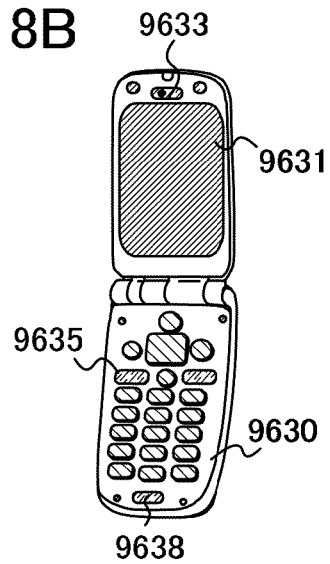

FIG. 18B illustrates a mobile phone that can include the housing 9630, the display portion 9631, the speaker 9633, the operation keys 9635, a microphone 9638, and the like. The mobile phone in FIG. 18B can have a function of displaying a variety of information (e.g., a still image, a moving image, and a text image) on the display portion; a function of displaying a calendar, a date, the time, or the like on the display portion; a function of operating or editing the information displayed on the display portion; a function of controlling processing by various kinds of software (programs); and the like. Note that the functions of the mobile phone in FIG. 18B are not limited to those described above, and the mobile phone can have various functions.

Figure 18C:
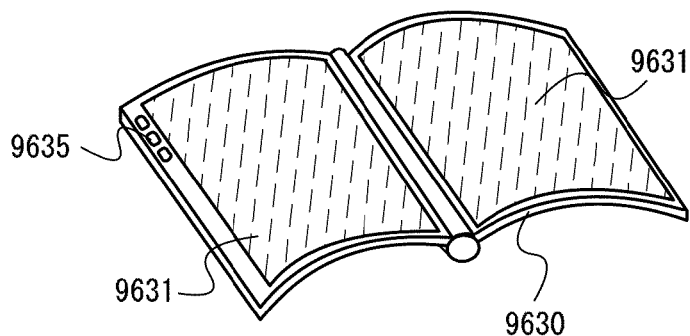

FIG. 18C illustrates an electronic paper terminal (also referred to as an eBook or an e-book reader) that can include the housing 9630, the display portion 9631, the operation keys 9635, and the like. The electronic paper in FIG. 18C can have a function of displaying a variety of information (e.g., a still image, a moving image, and a text image) on the display portion; a function of displaying a calendar, a date, the time, or the like on the display portion; a function of operating or editing the information displayed on the display portion; a function of controlling processing by various kinds of software (programs); and the like. Note that the electronic paper in FIG. 18C can have a variety of functions without being limited to the above.

The electronic devices described in this embodiment each can include a liquid crystal display device in which the aperture ratio of a plurality of pixels included in the display portion can be increased.

This embodiment can be implemented in combination with any of the structures described in the other embodiments as appropriate.

This application is based on Japanese Patent Application serial no. 2009-242787 filed with Japan Patent Office on Oct. 21, 2009, the entire contents of which are hereby incorporated by reference.

EXPLANATION OF REFERENCE

101: wiring, 102A: wiring, 102B: wiring, 103: oxide semiconductor layer, 105: pixel electrode, 106: thin film transistor, 111: substrate, 112: base film, 113: gate insulating film, 114: oxide insulating layer, 121: opening portion, 700: substrate, 701: pixel, 702: pixel portion, 703: scan line drive circuit, 704: signal line drive circuit, 880: pixel, 884: wiring, 885: wiring, 887: wiring, 889: common wiring, 984: signal, 985: signal, 1080: subpixel, 1081: transistor, 1082: liquid crystal element, 1084: wiring, 1085: wiring, 1088: pixel electrode, 2101: wiring, 2102A: wiring, 2102B: wiring, 2103: oxide semiconductor layer, 2104: capacitor line, 2105: pixel electrode, 2106: thin film transistor, 2111: substrate, 2112: base film, 2113: gate insulating film, 2114: oxide insulating layer, 3880: pixel, 3881: transistor, 3882: liquid crystal element, 3883: capacitor, 3884: wiring, 3885: wiring, 3886: wiring, 3887: wiring, 9630: housing, 9631: display portion, 9633: speaker, 9635: operation key, 9636: connection terminal, 9638: microphone, 9672: recording medium insert reading portion, 9676: shutter button, 9677: image receiving portion, 9680: external connection port, and 9681: pointing device.

The invention claimed is:

1. A liquid crystal display device comprising:
    a transistor;
    a liquid crystal element electrically connected to the transistor; and
    an auxiliary capacitor electrically connected to the transistor and the liquid crystal element,
    wherein a channel formation region of the transistor is in an intrinsic or substantially intrinsic oxide semiconductor layer,
    wherein the liquid crystal element is provided in a pixel,
    wherein a capacitance of the auxiliary capacitor is smaller than a capacitance of the liquid crystal element,
    wherein the transistor has electric characteristics such that an off-current flowing through a region serving as the channel formation region is $1 \times 10^{-12}$ A or less under a condition at which a temperature is 120° C., and
    wherein a voltage between a source and a drain of the transistor is 6 V at the condition.

2. A liquid crystal display device according to claim 1, wherein the intrinsic or substantially intrinsic oxide semiconductor layer has a hydrogen concentration of $5 \times 10^{19}$/cm$^3$ or less and a carrier concentration of $5 \times 10^{14}$/cm$^3$ or less.

3. A liquid crystal display device according to claim 1, wherein the liquid crystal element is provided in a subpixel included in the pixel.

4. A liquid crystal display device according to claim 1, wherein the transistor further comprises:
    a gate electrode;
    a gate insulating layer overlapping with the gate electrode; and
    a source electrode and a drain electrode in contact with part of the intrinsic or substantially intrinsic oxide semiconductor layer,
    wherein the intrinsic or substantially intrinsic oxide semiconductor layer overlaps with the gate electrode.

5. An electronic device comprising the liquid crystal display device according to claim 1.

6. A liquid crystal display device comprising:
    a transistor comprising:
        a gate electrode;
        a gate insulating layer over the gate electrode; and
        an intrinsic or substantially intrinsic oxide semiconductor layer over the gate electrode; and
    an insulating layer over and in contact with the intrinsic or substantially intrinsic oxide semiconductor layer;
    a liquid crystal element electrically connected to the transistor; and
    an auxiliary capacitor electrically connected to the transistor and the liquid crystal element,
    wherein the liquid crystal element is provided in a pixel,
    wherein a capacitance of the auxiliary capacitor is smaller than a capacitance of the liquid crystal element,
    wherein the transistor has electric characteristics such that an off-current flowing through a region serving as a channel formation region is $1 \times 10^{-12}$ A or less under a condition at which a temperature is 120° C., and
    wherein a voltage between a source and a drain of the transistor is 6 V at the condition.

7. A liquid crystal display device according to claim 6, wherein the intrinsic or substantially intrinsic oxide semiconductor layer has a hydrogen concentration of $5 \times 10^{19}$/cm$^3$ or less and a carrier concentration of $5 \times 10^{14}$/cm$^3$ or less.

8. A liquid crystal display device according to claim 6, wherein the liquid crystal element is provided in a subpixel included in the pixel.

9. An electronic device comprising the liquid crystal display device according to claim 6.

10. A liquid crystal display device comprising:
    a transistor comprising:
        a gate electrode;
        an intrinsic or substantially intrinsic oxide semiconductor layer; and
        a gate insulating layer between the gate electrode and the intrinsic or substantially intrinsic oxide semiconductor layer;
    a liquid crystal element electrically connected to the transistor; and
    an auxiliary capacitor electrically connected to the transistor and the liquid crystal element,
    wherein the liquid crystal element is provided in a pixel,
    wherein a capacitance of the auxiliary capacitor is smaller than a capacitance of the liquid crystal element,
    wherein the transistor has electric characteristics such that an off-current flowing through a region serving as a channel formation region is $1 \times 10^{-12}$ A or less under a condition at which a temperature is 120° C., and
    wherein a voltage between a source and a drain of the transistor is 6 V at the condition.

11. A liquid crystal display device according to claim 10, wherein the intrinsic or substantially intrinsic oxide semiconductor layer has a hydrogen concentration of $5 \times 10^{19}$/cm$^3$ or less and a carrier concentration of $5 \times 10^{14}$/cm$^3$ or less.

12. A liquid crystal display device according to claim 10, wherein the liquid crystal element is provided in a subpixel included in the pixel.

13. An electronic device comprising the liquid crystal display device according to claim 10.

14. A liquid crystal display device comprising:
    a liquid crystal panel; and
    a driver circuit IC,
    the liquid crystal panel comprising:
        a first wiring;
        a second wiring;
        a transistor;
        a liquid crystal element; and
        a capacitor,
    wherein a gate of the transistor is electrically connected to the first wiring,
    wherein one of a source and a drain of the transistor is electrically connected to the second wiring,
    wherein the other of the source and the drain of the transistor is electrically connected to the liquid crystal element and the capacitor,
    wherein a channel formation region of the transistor is in an intrinsic or substantially intrinsic oxide semiconductor layer,
    wherein a capacitance of the capacitor is smaller than a capacitance of the liquid crystal element, and
    wherein the transistor has electric characteristics such that an off-current flowing through a region serving as the channel formation region is $1 \times 10^{-12}$ A or less under a condition at which a temperature is 120° C.

15. A liquid crystal display device according to claim 14, wherein the oxide semiconductor layer is provided so as to overlap the gate with a gate insulating layer interposed therebetween.

16. An electronic device comprising the liquid crystal display device according to claim 14.

\* \* \* \* \*

UNITED STATES PATENT AND TRADEMARK OFFICE
CERTIFICATE OF CORRECTION

PATENT NO. : 9,559,208 B2
APPLICATION NO. : 12/906178
DATED : January 31, 2017
INVENTOR(S) : Ryo Arasawa et al.

It is certified that error appears in the above-identified patent and that said Letters Patent is hereby corrected as shown below:

In the Specification

At Column 20, Line 56, "880i," should be --880_i,--;

At Column 22, Line 54, "$1.30 \times 10^{10}$" should be --$1.30 \times 10^{-10}$--;

In the Claims

In Claim 6, at Column 25, Line 50, "electrode; and" should be --electrode;--.

Signed and Sealed this
Twenty-third Day of May, 2017

Michelle K. Lee
*Director of the United States Patent and Trademark Office*